United States Patent [19]

Suzuki

[11] Patent Number: 5,998,091

[45] Date of Patent: Dec. 7, 1999

[54] RADIATION SENSITIVE COLORED COMPOSITION

[75] Inventor: Nobuo Suzuki, Shizuoka, Japan

[73] Assignee: Fuji Photo Film Co., Ltd., Kanagawa, Japan

[21] Appl. No.: 09/041,678

[22] Filed: Mar. 13, 1998

[30] Foreign Application Priority Data

Mar. 14, 1997 [JP] Japan ..................................... 9-061457

[51] Int. Cl.$^6$ ............................. G03F 7/033; G03F 7/004
[52] U.S. Cl. ........................ 430/270.1; 430/7; 430/281.1; 430/910; 522/75; 522/78
[58] Field of Search .............................. 430/270.1, 281.1, 430/7, 905, 906, 910; 522/75, 78

[56] References Cited

U.S. PATENT DOCUMENTS 4,820,619  4/1989  Sanada et al. .......................... 430/197
5,847,015  12/1998 Tajima et al. ............................. 522/75

FOREIGN PATENT DOCUMENTS 7-311461  11/1995  Japan .
9-062002  3/1997  Japan .

*Primary Examiner*—John A. McPherson
*Attorney, Agent, or Firm*—Sughrue, Mion, Zinn, Macpeak & Seas, PLLC

[57] ABSTRACT

A radiation sensitive colored composition which enables pigments to have excellent dispersibility and can have dispersion stability with a lapse of time, and forming a color filter using the foregoing composition, thereby ensuring excellent film properties, almost no development residue and satisfactory pattern reproduction in the color filter, which composition comprising (A) a copolymer which is produced by copolymerizing at least (1) a monofunctional macromonomer having a polymeric main chain comprising a repetition of at least one specified unit constituent and a particular polymerizable double bond-containing group situated at only one end of the main chain, (2) a specified monomer, (3) a quaternary ammonium salt monomer and (4) a monomer containing at least one specified acid amido group in the molecule, (B) a radiation sensitive compound and (C) a pigment.

9 Claims, No Drawings

RADIATION SENSITIVE COLORED COMPOSITION

FIELD OF THE INVENTION

The present invention relates to a radiation sensitive colored composition in which a pigment is dispersed and, more particularly, to a pigment-dispersed radiation sensitive colored composition suitable for the production of a color filter to be used in a liquid crystal display element or a solid image-pickup element. More precisely, the invention concerns a pigment-dispersed radiation sensitive colored composition which has undergone improvements in pigment dispersibility and dispersion ageing stability and, when it is used for producing a color filter, can ensure excellent pattern reproducibility in the color filter.

BACKGROUND OF THE INVENTION

With respect to methods of producing color filters to be used in a liquid crystal display element and a solid pickup element, there are known a dyeing method, a printing method, an electrodeposition method and a pigment dispersing method.

In the case of adopting a dyeing method, a color filter is produced by dyeing a base material comprised of a natural resin, such as gelatin, glue or casein, or a synthetic resin, e.g., an amine-modified polyvinyl alcohol, with an acid dye or the like.

One problem of such a dyeing method is that the color filters produced are not good in light resistance, heat resistance and moisture resistance because dyes are used therein, and other problems thereof are, e.g., that a large-sized screen is apt to be dyed unevenly because of a difficulty in controlling so as to render dyeing and adherence characteristics uniform over the screen all, and that the printing resist layer is required at the time of dyeing to complicate the production process.

In the case of using the electrodeposition method, the process of producing a color filter comprises steps of forming in advance a transparent electrode having an intended pattern, ionizing a pigment-containing resin dissolved or dispersed in a solvent and applying a voltage thereto to form the intended pattern of colored image.

Such an electrodeposition method also has some problems. For instance, it requires a photolithographic process, which comprises the formation of a transparent electrode film for producing a color filter and the etching step, in addition to the step of forming a transparent electrode for display. The short formed in the foregoing process causes a linear defect to result in the lowering of yield rate. Further, it is difficult in principle to apply such a method to a mosaic arrangement and others, excepting a stripe arrangement, and the maintenance of transparent electrodes is not easy.

The printing method is a simple method for producing a color filter, wherein the printing operation according to an offset printing technique or the like is performed using an ink containing a pigment dispersed in a thermosetting or ultraviolet-curable resin. However, the ink usable therein is difficult to filter because of its high viscosity, so that the color filter produced tends to have defects arising from dust, foreign matter and gelled part of the ink binder. Another problem of the color filter produced is that the precision in position and line-width, which depend on the precision of the printing technique used, and the surface smoothness are not good.

In the case of using a pigment dispersion method, a color filter is produced from radiation sensitive colored compositions, or various photosensitive compositions in which pigments are dispersed, in accordance with photolithography. The color filter produced therein is stable to light and heat since pigments are used, and further the patterning is sufficiently precise in position because it is carried out by photolithography. Therefore, this method is well suited for the production of a color filter applicable to wide-screen high definition color display.

Although the dispersion of pigment in a light-sensitive polyimide resin is disclosed in JP-A-60-237403 (The term "JP-A" as used herein means an "unexamined published Japanese patent application"), the light absorption develops in the visible region when the polyimide resin film is at least 1.0 μm in thickness, thereby causing a color reproducibility problem.

When the pigment dispersibility in a color filter produced using a pigment dispersion method is unsatisfactory, not only deterioration in color purity and dimensional precision becomes a problem, but also the display contrast is considerably lowered due to a depolarizing action. Further, the pigment-dispersed radiation sensitive composition produces aggregates with the lapse of time, thereby lowering the coatability and causing the aforementioned problems in the color filter produced therefrom.

As a means of heightening the pigment dispersibility, JP-A-1-102429 discloses the method of using a processed pigment obtained by treating a pigment with an acrylic resin, a maleic acid resin, a vinyl chloride-vinyl acetate resin or the like, and JP-A-2-181704 and JP-A-2-199403 disclose the method of using organic dye derivatives as a dispersing agent. However, those methods cannot bring about satisfactory solutions for the aforementioned problems.

Also, a surfactant-utilized dispersion method is known. However, this method has a defect that a reaction occurs between the surfactant and the pigment or resin used therein or the surfactant separates out in the course of using the color filter.

Further, the method of dispersing a pigment by using the combination of an ionic surfactant with an ionic resin having the same polarity as the surfactant is disclosed in JP-A-4-76062. As it is, such a method fails in producing satisfactory results.

On the other hand, JP-B-4-39041 (The term "JP-B" as used herein means an "examined Japanese patent publication") discloses the method of producing a color filter by the use of a pigment having a particular grain size. In order to obtain pigment grains having a particular size, centrifugation of pigment grains and filtration of the centrifuged grains through a glass filter or membrane filter are performed therein. According to such a method, the pigment grains of an intended size are obtained, but the production process comprises complicated steps and has an inferior efficiency.

JP-A-7-140654 proposes the radiation sensitive composition comprising a resin prepared from an alkali-soluble monomer, a monomer having an alcoholic hydroxyl group and a macromonomer of styrene and methylmethacrylate. Such a resin is however unsatisfactory in pigment dispersibility.

The production of a color filter according to a pigment dispersion method can be effected as follows: A radiation sensitive composition is coated on a glass substrate by means of a spin coater or roll coater, and dried to form a film. This film is exposed to light through a pattern, and then developed to obtain a colored image. These operations are performed for each color. In the formation of pixels by the use of conventional radiation sensitive compositions, however, the pixels are liable to come off the substrate during the development or washing operation; as a result, the color filter produced is likely to have defects. If the adhesiveness of the pixels to the substrate is heightened as a measure to prevent the aforementioned phenomenon, however, the color filter obtained is likely to have a scum problem and the like because the solubility of non-image areas upon development is lowered.

SUMMARY OF THE INVENTION

The present invention has been made in order to solve various problems of the conventional arts mentioned above. Therefore, an object of the present invention is to provide a radiation sensitive colored composition which enables an elevation of pigment dispersibility.

Another object of the present invention is to provide a radiation sensitive colored composition in which a pigment can be dispersed in a finely divided condition and the pigment dispersed can have an improved ageing stability.

A further object of the present invention is to provide a radiation sensitive colored composition which can form a coating of high quality, hardly causes a scum problem after development, ensures favorable adhesiveness in the pixels formed, has satisfactory pattern reproducibility, ensures a sharp edge in the pattern reproduced, and can produce a color filter having an excellent color contrast.

The above-described objects of the present invention are attained with the following constitution [1], [2], [3], [4], [5] or [6].

The constitution [1] is a radiation sensitive colored composition comprising (A) a copolymer prepared by copolymerizing at least (1) a monofunctional macromonomer which has a weight-average molecular weight of $3 \times 10^4$ or below and comprises a polymeric moiety having a repetition of at least one kind of unit constituent represented by the following formula (IIa) or (IIb) and a polymerizable double bond-containing group represented by the following formula (I) situated at only one end of the polymeric moiety, (2) a monomer represented by the following formula (III), (3) a quaternary ammonium salt monomer and (4) a monomer having at least one unsubstituted or substituted acid amide group represented by the following formula (IV) in the molecule; (B) a radiation sensitive compound; and (C) a pigment:

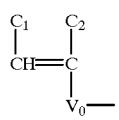
(I)

wherein $V_0$ represents —COO—, —OCO—, —CH$_2$OCO—, —CH$_2$COO—, —O—, —SO$_2$—, —CO—, —CONHCOO—, —CONHCONH—, —CONHSO$_2$—, —CON(P$_3$)—, —SO$_2$N(P$_3$)— or —C$_6$H$_4$—; P$_3$ represents a hydrogen atom or a hydrocarbon group; $c_1$ and $c_2$ are the same or different, and each of them represents a hydrogen atom, a halogen atom, a cyano group, a hydrocarbon group, —COO—Z' or a group having —COO—Z' via a hydrocarbon; and Z' represents a hydrogen atom or an optionally substituted hydrocarbon group:

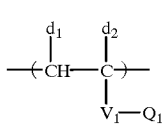
(IIa)

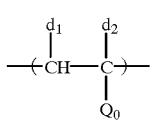
(IIb)

wherein $V_1$ has the same meaning as $V_0$ in formula (I); $Q_1$ represents an aliphatic group having 1 to 18 carbon atoms or an aromatic group having 6 to 12 carbon atoms; $d_1$ and $d_2$ are the same or different, and they have the same meanings as $c_1$ and $c_2$ in formula (I) respectively; $Q_0$ represents —CN or —C$_6$H$_4$—T; T represents a hydrogen atom, a halogen atom, a hydrocarbon group, an alkoxy group or —COOZ''; and Z'' represents an alkyl group, an aralkyl group or an aryl group:

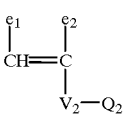
(III)

wherein $V_2$ has the same meaning as $V_1$ in formula (IIa); $Q_2$ has the same meaning as $Q_1$ in formula (IIa); and $e_1$ and $e_2$ have the same meanings as $c_1$ and $c_2$ in formula (I) respectively:

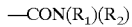
—CON(R$_1$)(R$_2$) (IV)

wherein $R_1$ and $R_2$, which may be the same or different, each represents a hydrogen atom or a hydrocarbon group having 1 to 18 carbon atoms, which may have a substituent, or $R_1$ and $R_2$ may combine with each other via —O—, —S— or —NR$_3$—; and $R_3$ represents a hydrogen atom or a hydrocarbon group having 1 to 12 carbon atoms.

The constitution [2] is a radiation sensitive colored composition as described in the constitution [1], wherein the quaternary ammonium salt monomer is at least one monomer selected from the monomers of the following formulae (a) to (e):

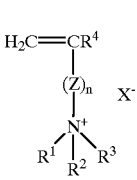
(a)

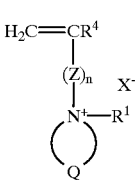
(b)

-continued

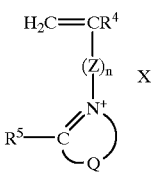
(c)

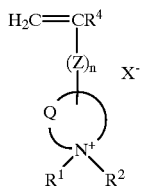
(d)

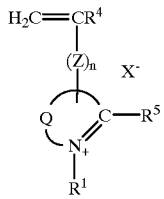
(e)

wherein $R^1$, $R^2$ and $R^3$ are each a hydrogen atom, or each of them has the same meaning as $Q_1$ in formula (IIa); $R^4$ and $R^5$ have the same meanings as $c_1$ and $c_2$ in formula (I) respectively; Q represents atoms completing a heterocyclic ring; $X^{-1}$ is an anion; Z is a linkage group selected from the group consisting of —$R^6$—, —C(O)—$OR^6$—, —C(O)—NH—$R^6$—, —O—C(O)—$R^6$— and —$CH_2OC(O)$—$R^6$, wherein $R^6$ has the same meaning as $Q_1$ in formula (I); and n is 0 or 1.

The constitution [3] is a radiation sensitive colored composition as described in the constitution [1] or [2], wherein the monomer having at least one unsubstituted or substituted acid amido group represented by the foregoing formula (IV) in the molecule is a monomer represented by the following formula (V):

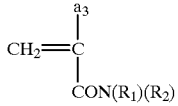
(V)

wherein $a_1$ and $a_2$ have the same meanings as $c_1$ and $c_2$ in the foregoing formula (I) respectively; $R_1$ and $R_2$ have the same meanings as $R_1$ and $R_2$ in the foregoing formula (IV) respectively; X represents a single bond, —COO—, —OCO—, —$(CH_2)_{u1}$—COO—, —$(CH_2)_{u2}$—OCO—, wherein u1 and u2 are each an integer of 1 to 3, —CON($R_4$)—, wherein $R_4$ is a hydrogen atom or a hydrocarbon group having 1 to 12 carbon atoms, —CONH—COO—, —O—, —$C_6H_4$— or —$SO_2$—; and Y represents a single bond, a linkage group selected from the group consisting of —[C($R_5$)($R_6$)]—, —$C_6H_4$—, —$C_6H_{10}$—, —$(CH_2)_n$—, —[C($R_7$)=C($R_8$)]—, —COO—, —OCO—, —O—, —S—, —$SO_2$—, —N($R_9$)—, —CON($R_{10}$)—, —$SO_2N(R_{11})$—, —NHCOO—, —NHCONH— and —C(=O)—, or a combination of two or more of the linkage groups recited above, wherein $R_5$, $R_6$, $R_7$ and $R_8$, which may be the same or different, each represents a hydrogen atom, a halogen atom or a hydrocarbon group having 1 to 7 carbon atoms, $R_9$, $R_{10}$ and $R_{11}$ each have the same meaning as the foregoing $R_4$, and n represents an integer of 2 to 8.

The constitution [4] is a radiation sensitive colored composition as described in any one of the constitutions [1] to [3], wherein the monomer of the foregoing formula (V) is a monomer represented by the following formula (VI):

$$CH_2 = \overset{a_3}{\underset{CON(R_1)(R_2)}{C}}$$
(VI)

wherein $a_3$ has the same meaning as $a_1$ or $a_2$ in the foregoing formula (V), and $R_1$ and $R_2$ have the same meanings as $R_1$ and $R_2$ in the foregoing formula (IV) respectively.

The constitution [5] is a radiation sensitive colored composition as described in any one of the constitutions [1] to [4], wherein the monomer of the foregoing formula (VI) is acrylamide or methacrylamide.

The constitution [6] is a radiation sensitive colored composition as described in any one of the constitutions [1] to [5], which further comprises an alkali-soluble resin.

DETAILED DESCRIPTION OF THE INVENTION

The pigment-containing radiation sensitive colored composition according to the present invention contains as essential components (A) a graft copolymer having a particular structure, (B) a radiation sensitive compound and (C) a pigment, and further can contain as an optional component an alkali-soluble resin for the purpose of elevating the developability. By constituting a radiation sensitive composition as in the present invention, the pigment can have satisfactory dispersibility in the radiation sensitive composition, that is, the pigment can be finely dispersed without spending much energy and time, and the pigment dispersed in the radiation sensitive composition does not cause agglutination or sedimentation with a lapse of time, so that the pigment-dispersed radiation sensitive composition can retain good dispersion stability for a long time. Accordingly, the radiation sensitive composition according to the present invention has excellent coatability, and provides a coating having slight turbidity to ensure high transmittance.

Further, the film formed by coating and drying the present composition on a substrate has high transparency, satisfactory adhesiveness to the substrate and high sensitivity upon imagewise exposure, and hardly causes scum upon development. Further, the pixels formed therein have excellent adhesiveness to the substrate, slight dependence on development conditions or wide development latitude, and reduced notches on their edges (namely high edge sharpness). Therefore, color filters with high pattern reproducibility can be produced by the use of pigment-containing radiation sensitive colored compositions according to the present invention.

The present invention is characterized in that a graft copolymer having specific acid amide group-containing monomers and quaternary ammonium salt monomer residues in the main chain is used as the component (A) of a radiation sensitive colored composition to ensure excellent properties, especially excellent pigment dispersibility, in the radiation sensitive colored composition.

With respect to pigments added to radiation sensitive compositions, although various known inorganic and organic pigments can be used in the present invention, the use of isoindoline or isoindolinone pigments, especially Pigment Yellow 109 (the name Pigment Yellow is abbreviated as P.Y. hereinafter), P.Y. 110, P.Y. 139, P.Y. 150, P.Y. 185 (which are expressed in C.I. representation) and carbon black, can further enhance the effects of the present invention.

Reasons why the present invention can produce excellent effects are not made sufficiently clear, but they can be assumed as follows:

With the intention of making an improvement in pigment dispersibility, copolymers having various functional groups (e.g., a carboxyl group, a hydroxyl group, a sulfonic acid group, a substituted or unsubstituted amino group) are used as binder resin or dispersing agent in pigment-containing radiation sensitive colored compositions, but the fact is that they cannot bring about sufficient improvements in the pigment dispersibility. This is because those copolymers are random copolymers in many cases, and the functional groups present in a random copolymer cannot firmly adsorb to pigments and, in some cases, aggregation of pigment particles are promoted by the addition of those copolymers.

On the other hand, it can be thought that the graft copolymer used in the present invention has specific acid amide group-containing monomers and quaternary ammonium salt monomer residues in the trunk part (main chain) and a macromonomer in the branch part (graft part) to enable improvements in orientation and adsorption to pigments, and further the macromonomer in the branch part can enhance dispersibility and dispersion stability upon ageing through its steric repulsion effect.

The term "quaternary ammonium salt monomer residues" as used herein refers to the groups which are incorporated in the main chain of a copolymer when a copolymerizable double bond compound having a quaternary ammonium salt in the side chain (namely, a quaternary ammonium salt monomer) is copolymerized with a macromonomer, a monomer represented by formula (III) and so on.

In addition, when the radiation sensitive colored composition of the present invention is used, the pixels formed therefrom do not come off and the non-image area is free from residues. In other words, the image area has excellent adhesiveness and the non-image area has high solubility. These excellent properties are supposed to be brought about by the combined use of the graft copolymer defined above and a radiation sensitive compound, though there is no certain evidence of this supposition.

In the radiation sensitive colored composition of the present invention, it is desirable that an alkali-soluble resin be further added to the composition, and it is favorable to use a pigment capable of forming a fine-grain dispersion. As for such a pigment, isoindoline or isoindolinone pigments are suitable examples thereof. In particular, P.Y. 109, P.Y. 110, P.Y. 139, P.Y. 150, P.Y. 185 (which are expressed in C.I. representation) are preferred over the others. When isoindoline or isoindolinone pigments are used, the pigment dispersibility is remarkably improved and suffers no deterioration with a lapse of time.

When the radiation sensitive colored composition of the present invention is coated on a substrate, such as glass, and then dried, the coating obtained has excellent film quality and high transparency. The coating which has undergone imagewise exposure and development subsequent thereto hardly causes a scum trouble, forms pixels having excellent adhesiveness, has wide development latitude, suffers no pixel coming-off trouble, and has no residue in the non-image area. Further, the coating of the present composition has an enormous advantage in that the pixels formed therein have excellent edge sharpness and highly transparent color. These advantages are supposed to be driven from the combined use of the aforementioned graft copolymer, a pigment, a radiation sensitive compound, and further an alkali-soluble resin, if desired.

The copolymer serving as the component (A) of the present composition (which is abbreviated as the present Copolymer (A)) is illustrated below.

Being a graft copolymer fulfilling the aforementioned requirements for physical properties and comprising at least the specified monofunctional macromonomer (MB) residues, monomer residues of formula (III), quaternary ammonium salt monomer residues and monomer residues containing acid amide groups of formula (IV) is a characteristic of the present Copolymer (A) (which is therefore called the present graft Copolymer (A), hereinafter).

Preferably, the present graft Copolymer (A) is a graft copolymer having a weight-average molecular weight of at least $1 \times 10^4$, particularly from $2 \times 10^4$ to $5 \times 10^5$.

When the molecular weight is below $1 \times 10^4$, the effects of the present invention, particularly the effect on dispersibility, cannot be fully achieved; while the molecular weight of above $5 \times 10^5$ tends to cause drops in solubility.

The monofunctional macromonomer (MB) is constituted of a polymeric moiety having a repetition of at least one kind of unit constituent represented by the following formula (IIa) or (IIb) and a polymerizable double bond-containing group represented by the following formula (I) situated at only one end of the polymeric moiety, and has a weight-average molecular weight of $3 \times 10^4$ or below.

In the description of formulae (I), (IIa) and (IIb), the number of carbon atoms contained in a hydrocarbon group, which is represented by or present in a group represented by $c_1, c_2, V_0, d_1, d_2, V_1, Q_1$ and $Q_2$ each, is given as the number of carbon atoms in the unsubstituted group, and such a hydrocarbon group may have a substituent.

Specifically, $V_0$ in formula (I) represents —COO—, —OCO—, —CH$_2$OCO—, —CH$_2$COO—, —O—, —SO$_2$—, —CO—, —CONHCOO—, —CONHCONH—, —CONHSO$_2$—, —CON(P$_3$)—, —SO$_2$(P$_3$)— or —C$_6$H$_4$—. Herein, P$_3$ represents a hydrogen atom or a hydrocarbon group. Specific examples of such a hydrocarbon group include optionally substituted 1–18C alkyl groups (such as methyl, ethyl, propyl, butyl, heptyl, hexyl, octyl, decyl, dodecyl, hexadecyl, octadecyl, 2-chloroethyl, 2-bromoethyl, 2-cyanoethyl, 2-methoxycarbonylmethyl, 2-methoxyethyl and 3-bromopropyl groups), optionally substituted 4–18C alkenyl groups (such as 2-methyl-1-propenyl, 2-butenyl, 2-pentenyl, 3-methyl-2-pentenyl, 1-pentenyl, 1-hexenyl, 2-hexenyl and 4-methyl-2-hexenyl group), optionally substituted 7–12C aralkyl groups (such as benzyl, phenetyl, 3-phenylpropyl, naphthylmethyl, 2-naphthylethyl, chlorobenzyl, bromobenzyl, methylbenzyl, ethylbenzyl, methoxybenzyl, dimethylbenzyl and dimethoxybenzyl groups), optionally substituted 5–8C alicyclic groups (such as cyclohexyl, 2-cyclohexylethyl and 2-cyclopentylethyl groups) and optionally substituted 6–12C aromatic groups (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propionamidophenyl and dodecyloylamidophenyl groups).

When $V_0$ represents —$C_6H_4$—, the benzene ring may have a substituent. As for the substituent, a halogen atom (e.g., chlorine, bromine), an alkyl group (e.g., methyl, ethyl, propyl, butyl, chloromethyl, methoxymethyl) and an alkoxy group (e.g., methoxy, ethoxy, propoxy, butoxy) are examples thereof.

In formula (I), $c_1$ and $c_2$ are the same or different, and each of them preferably represents a hydrogen atom, a halogen atom (e.g., chlorine, bromine), a cyano group, a hydrocarbon group having 1 to 4 carbon atoms (e.g., methyl, ethyl, propyl, butyl), —COO—Z' or a group having —COO—Z' via a hydrocarbon (wherein Z' represents a hydrogen atom, or a 1–18C alkyl, alkenyl, aralkyl, alicyclic or aryl group which may be substituted, with specific examples including those recited in the foregoing description of the hydrocarbon group represented by $P_3$).

As for the divalent hydrocarbon group in the group having —COOZ' via a hydrocarbon, a methylene group, an ethylene group and a propylene group are examples thereof.

More preferably, in formula (I), $V_0$ represents —COO—, —OCO—, —$CH_2OCO$—, —$CH_2COO$—, —O—, —CONHCOO—, —CONHCONH—, —CONH—, —$SO_2NH$— or —$C_6H_4$—; and $c_1$ and $c_2$ are the same or different, and each of them represents a hydrogen atom, methyl group, —COO—Z' or —$CH_2$COO—Z' (wherein Z' represents a hydrogen atom, or a 1–6C alkyl group, such as methyl, ethyl, propyl, butyl or hexyl group). Much more preferably, either $c_1$ or $c_2$ represents a hydrogen atom.

More specifically, the polymerizable double bond-containing group represented by the following formula (I) includes the following groups:

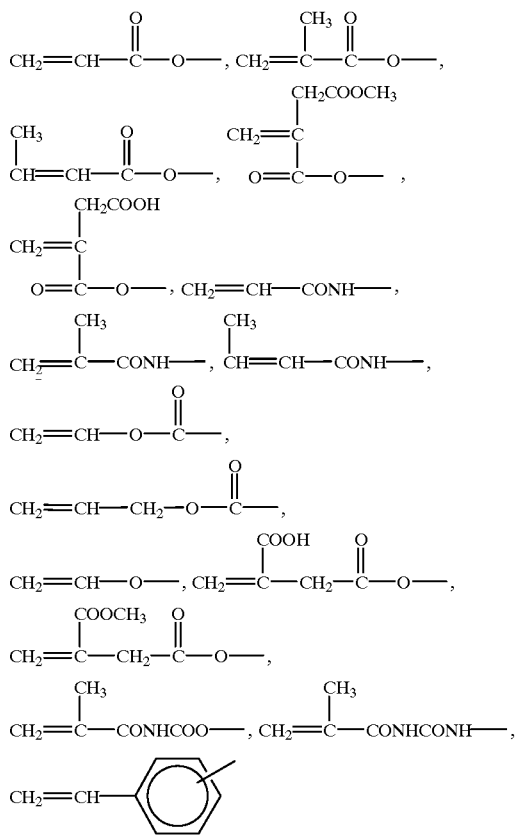

$V_1$ in formula (IIa) has the same meaning as $V_0$ in formula (I).

$d_1$ and $d_2$ in formulae (IIa) and (IIb) may be the same or different, and they have the same meanings as $c_1$ and $c_2$ in formula (I), respectively.

$Q_1$ in formula (IIa) represents an aliphatic group having 1 to 18 carbon atoms or an aromatic group having 6 to 12 carbon atoms. Specific examples of such an aliphatic group include optionally substituted 1–18C alkyl groups (such as methyl, ethyl, propyl, butyl, heptyl, hexyl, octyl, decyl, dodecyl, tridecyl, hexadecyl, octadecyl, 2-chloroethyl, 2-bromoethyl, 2-hydroxyethyl, 2-methoxyethyl, 2-ethoxyethyl, 2-cyanoethyl, 3-chloropropyl, 2-(trimethoxysilyl)ethyl, 2-tetrahydrofuryl, 2-thienylethyl, 2-N,N-dimethylaminoethyl and 2-N,N-diethylaminoethyl groups), 5–8C cycloalkyl groups (such as cycloheptyl, cyclohexyl and cyclooctyl groups) and optionally substituted 7–12C aralkyl groups (such as benzyl, phenetyl, 3-phenylpropyl, naphthylmethyl, 2-naphthylethyl, chlorobenzyl, bromobenzyl, dichlorobenzyl, methylbenzyl, chloro-methyl-benzyl, dimethylbenzyl, trimethylbenzyl and methoxybenzyl groups).

Specific examples of an aromatic group represented by $Q_1$ include optionally substituted 6–12C aromatic groups, such as phenyl, tolyl, xylyl, chlorophenyl, bromophenyl, dichlorophenyl, chloro-methyl-phenyl, methoxyphenyl, methoxycarbonylphenyl, naphthyl and chloronaphthyl groups.

In formula (IIa), $V_1$ is preferably —COO—, —OCO—, —$CH_2COO$—, —$CH_2OCO$—, —O—, —CO—, —CONHCOO—, —CONHCONH—, —CONH—, —$SO_2NH$— or —$C_6H_4$—.

Preferred examples of $d_1$ and $d_2$ include the same ones as recited above with respect to $c_1$ and $c_2$.

$Q_0$ in formula (IIb) represents —CN or —$C_6H_4$—T, and T represents a hydrogen atom, a halogen atom (such as a chlorine or bromine atom), a hydrocarbon group (such as a methyl, ethyl, propyl, butyl, chloromethyl or phenyl group), an alkoxy group (such as a methoxy or ethoxy group), or —COO—Z" (wherein Z" is preferably a 1–8C alkyl group, a 7–12C aralkyl group or an aryl group).

The macromonomer (MB) may have, in its polymeric moiety, repetitions of two or more kinds of unit constituents represented by formula (IIa) or (IIb). When $Q_1$ is an aliphatic group in formula (IIa), it is desirable that the 6–12C aliphatic group be used in a proportion of at most 20 weight % to the total constituents in the polymeric moiety of the macromonomer (MB).

Further, when $V_1$ in formula (IIa) is —COO—, it is desirable that the proportion of the unit constituent represented by formula (IIa) to the total of unit constituents be at least 30 weight % in the polymeric moiety of the macromonomer (MB).

As for the monomer(s) which can become constitutional repeating unit(s) in the polymeric moiety of the macromonomer (MB) by being copolymerized with the unit constituent(s) of formula (IIa) or/and (IIb), acrylonitrile, methacrylonitrile, styrene and the derivatives thereof (such as vinyltoluene, chlorostyrene, dichlorostyrene, bromostyrene, hydroxymethylstyrene and N,N-dimethylaminomethylstyrene) and heterocyclic vinyl compounds (such as vinylpyridine, vinylimidazole, vinylpyrrolidone, vinylthiophene, vinylpyrazole, vinyldioxane and vinyloxazine) are examples thereof.

The macromonomer (MB) to constitute the present graft Copolymer (A) has a chemical structure such that a polymerizing double-bond containing group represented by formula (I) is attached directly or indirectly (via a linkage group) to only one end of the polymeric moiety comprising repetition(s) of the unit constituent(s) represented by formula (IIa) and/or formula (IIb). As for the linkage group present between the group of formula (I) and the constituent of formula (IIa) or (IIb), a single or double bond formed between carbon atoms, a bond formed between carbon and a hetero atom (such as oxygen, sulfur, nitrogen or silicon atom) and a bond formed between hetero atoms.

Of the macromonomers (MB) usable in the present invention, those represented by the following formulae (Ma) and (Mb) are preferred over the others:

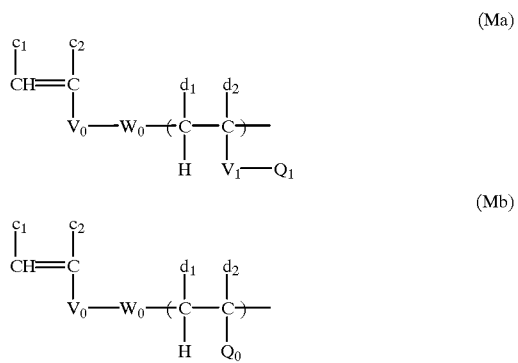

wherein $c_1$, $c_2$, $d_1$, $d_2$, $V_0$, $V_1$, $Q_1$ and $Q_0$ have the same meanings as those in formulae (I), (IIa) and (IIb); and $W_0$ is a mere bond, a linkage group made up of only one group selected from the groups illustrated below, or a linkage group formed by combining two or more of the groups illustrated below.

The groups to form the foregoing linkage group $W_0$ are —[C($h_1$)($h_2$)]— (wherein $h_1$ and $h_2$ are each a hydrogen atom, a halogen atom (e.g., fluorine, chlorine, bromine), a cyano group, a hydroxyl group, an alkyl group (e.g., methyl, ethyl, propyl) or so on),

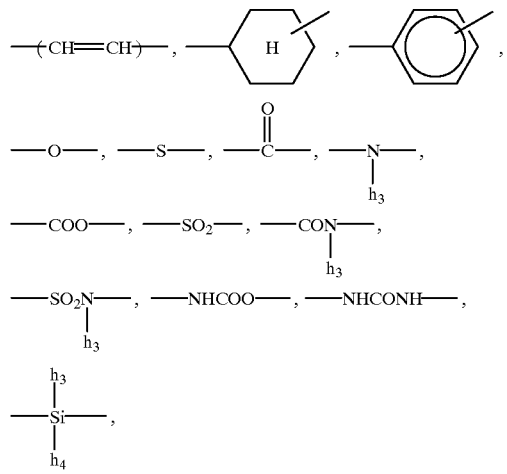

(wherein $h_3$ and $h_4$ are each a hydrogen atom, or a hydrocarbon group having the same meaning as $Q_1$ in formula (IIa)).

When the macromonomer (MB) has a weight-average molecular weight of higher than $3\times10^4$, its ability to copolymerize with a monomer of formula (III), a quaternary ammonium salt monomer and a monomer containing an acid amide group of formula (IV) is lowered; while it is desirable for the molecular weight to be at least $1\times10^3$, because the macromonomer has a small effect in elevating the pigment dispersibility when the molecular weight is too small.

The macromonomer (MB) to constitute the present graft Copolymer (A) can be prepared using various conventional methods. Suitable examples of such a preparation method include an ionic polymerization-utilized method wherein the terminal of a living polymer prepared by anionic or cationic polymerization is made to react with an appropriate reagent to produce a macromer; a radical polymerization-utilized method wherein an oligomer having a reactive group at its end, which is prepared by radical polymerization using a polymerization initiator and/or chain transfer agent having a reactive group such as a carboxyl, hydroxyl or amino group, is made to react with an appropriate reagent to produce a macromer; and a polyaddition- or polycondensation-utilized method wherein a polymerizable double bond-containing group is introduced into an oligomer prepared by the polyaddition or polycondensation reaction in the same manner as in the foregoing radical polymerization process.

More specifically, the macromonomer (MB) can be prepared in accordance with the methods reviewed, e.g., in P. Dreyfuss & R. P. Quirk, *Encycl. Polym. Sci. Eng.*, 7, 551 (1987); P. F. Rempp and E. Franta, *Adv. Polym. Sci.*, 58, 1 (1984); V. Percec, *Appl. Polym. Sci.*, 285, 95 (1984); R. Asami and M. TakaRi, *Makromol. Chem. Suppl.*, 12, 163 (1985); P. Rempp et al., *Makromol. Chem. Suppl.*, 8, 3 (1984); Yusuke Kawakami, *Kagaku Kogyo*, 38, 56 (1987); Yuya Yamashita, *Kobunshi*, 31 (1982); Shiro Kobayashi, *Kobunshi*, 30, 625 (1981); Toshinobu Higashimura, *Nippon Settyaku-Kyokai-Shi*, 18, 536 (1982); Kohichi Itoh, *Kobunshi Kako*, 35, 262 (1986); and Kishiro Higashi and Takashi Tsuda, *Kino Zairyo*, 1987, No. 10, 5; and references and patent gazettes recited therein.

Specific examples of a macromonomer (MB) according to the present invention are illustrated below, but these exemplified compounds are not to be construed as limiting the scope of the invention in any way.

In the following structural formulae representing the exemplified macromonomers, $c_1$ is —H or —$CH_3$, $d_1$ is —H or —$CH_3$, $d_2$ is —H, $CH_3$ or —$CH_2COOCH_3$, $R_{11}$ is —$C_dH_{2d+1}$, —$CH_2C_6H_5$, —$C_6H_5$ or —$C_6H_4$—$CH_3$, $R_{12}$ is —$C_dH_{2d+1}$, —$(CH_2)_4$—$C_6H_5$ or —$C_6H_4$—$T_1$, $R_{13}$ is —$C_dH_{2d+1}$, —$CH_2C_6H_5$ or —$C_6H_5$, $R_{14}$ is —$C_dH_{2d+1}$ or —$CH_2C_6H_5$, $R_{15}$ is —$C_dH_{2d+1}$, —$CH_2C_6H_5$ or —$CH_2$—$C_6H_4$—$T_1$, $R_{16}$ is —$C_dH_{2d+1}$, $R_{17}$ is —$C_dH_{2d+1}$, —$CH_2C_6H_5$ or —$C_6H_4$—$T_2$, $R_{18}$ is —$C_dH_{2d+1}$, —$CH_2C_6H_5$ or —$C_6H_4$—$T_3$, $V_1$ is —$COOCH_3$, —$C_6H_5$ or —CN, $V_2$ is —$OC_dH_{2d+1}$, —$OCOC_dH_{2d+1}$, —$COOCH_3$, —$C_6H_5$ or —CN, $V_3$ is —$COOCH_3$, —$C_6H_5$, —$C_6H_4$—$T_4$ or —CN, $V_4$ is —$OCOC_dH_{2d+1}$, —CN or —$C_6H_5$, $V_5$ is —CN or —$C_6H_5$, $V_6$ is —$COOCH_3$, —$C_6H_5$ or —$C_6H_4$—$T_1$, $T_1$ is —$CH_3$, —Cl, —Br or —$OCH_3$, $T_2$ is —$CH_3$, —Cl or —Br, $T_3$ is —H, —Cl, —Br, —$CH_3$, —CN or —$COOCH_3$, $T_4$ is —$CH_3$, —Cl or —Br, $T_5$ is —Cl, —Br, —F, —OH or —CN, $T_6$ is —H, —$CH_3$, —Cl, —Br, —$OCH_3$ or —$COOCH_3$, d is an integer of 1 to 18, e is an integer of 1 to 3, and f is an integer of 2 to 4.

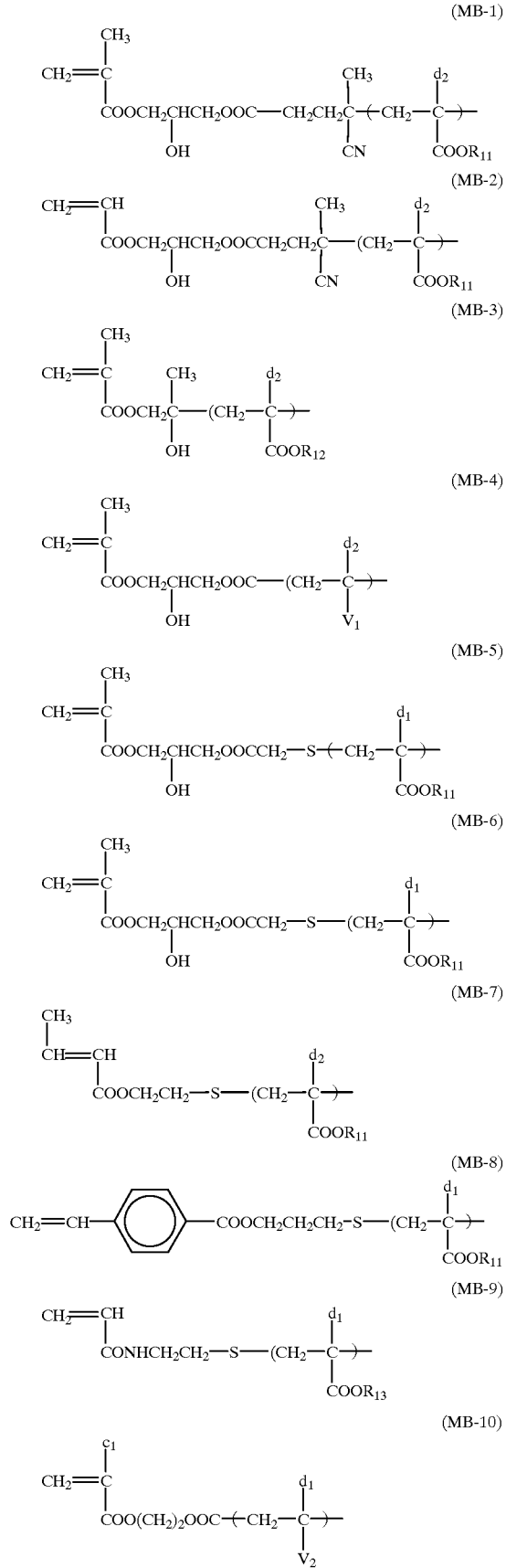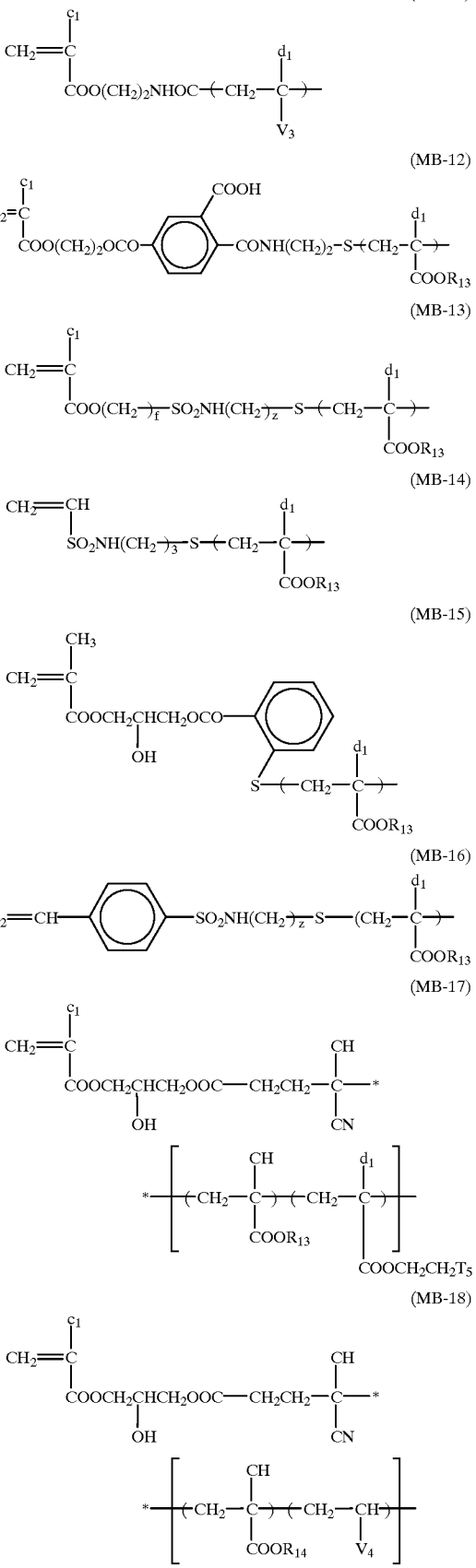

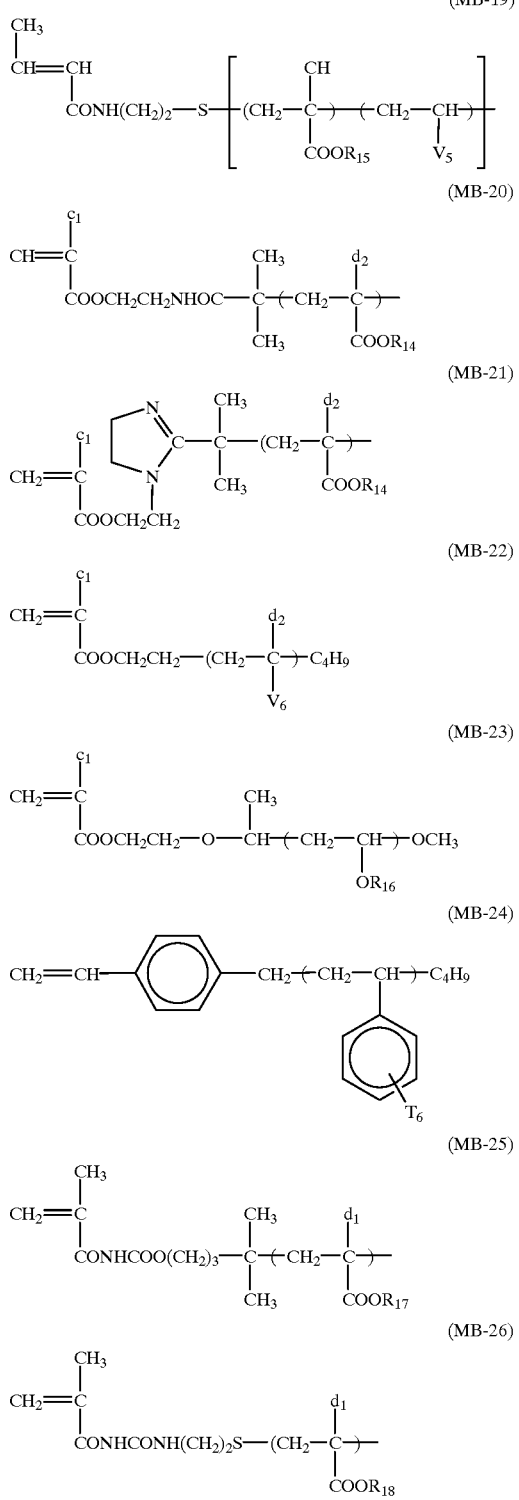

In addition, various commercially available macromonomers can also be used as the macromonomer (MB). As for the commercially available macromonomers, AA-6 (a methylmethacrylate macromonomer, produced by Toa Gosei Co., Ltd.), AS-6 (a styrene macromonomer, produced by Toa Gosei Co., Ltd.) and AB-6 (a butylacrylate macromonomer, produced by Toa Gosei Co., Ltd.) are examples thereof.

The monomers to undergo copolymerization with the macromonomer (MB) as described above are a monomer of the foregoing formula (III), a quaternary ammonium salt monomer (preferably the quaternary ammonium salt monomer of formula (a), (b), (c), (d) or (e) illustrated hereinbefore) and a monomer containing the acid amide group of formula (IV).

In formula (III), $e_1$ and $e_2$, which may be the same or different, have the same meanings as $c_1$ and $c_2$ in formula (I), $V_2$ has the same meaning as $V_1$ in formula (IIa) and $Q_2$ has the same meaning as $Q_1$ in formula (IIa).

In formulae (a) to (e) representing quaternary ammonium salt monomers, Q stands for two or more atoms completing a heterocyclic ring, examples of which include pyrrolidine, piperidine, morpholine, pyrrole, pyridine, pyrimidine, imidazole, indole, isoindole, quinoline, isoquinoline, benzimidazole, carbazole, acridine, oxazole and isooxazole. As for the anion $X^{-1}$, halogen ions and anions of sulfonic acid, carboxylic acid, thiocarboxylic acid and phosphonic acid are examples thereof.

Any monomer can be used as a quaternary ammonium salt monomer so far as it has a quaternary ammonium salt moiety. Specific examples of such a monomer include methacryloyloxyethyltrimethylammonium p-toluenesulfonate, methacryloyloxyethyltrimethylammonium chloride, methacryloyloxyethyldimethylethylammonium p-toluenesulfonate, methacryloyloxyethyldimethylisoproylammonium p-toluenesulfonate, acryloyloxyethyltrimethylammonium p-toluenesulfonate, dimethyloctadecylvinylbenzylammonium chloride, 2-vinyl-N-methylpyridinium methylsulfate, N-methyl-N-methacryloyloxyethylpiperidinium bromide and N-methacryloyloxyethylpiperidinium nitrate.

In addition, other heterocyclic ammonium salts which are the congeners of those pyridinium and piperidinium salts, e.g., morpholinium salts and thiamorpholinium salts, are as useful as the ammonium salts recited above.

Also, those monomers may have the form of tertiary amine when they undergo copolymerization. In this case, a proper quaternarizing reagent is made to act on the resultant copolymer, thereby giving them the quaternary ammonium salt form. As for the quaternarizing reagent, alkyl esters of p-toluenesulfonic acid, such as methyl p-toluenesulfonate, are suitable examples thereof.

Examples of a hydrocarbon group preferred as $R_1$ and $R_2$ each in formula (IV) include a 1–18C alkyl group which may be substituted (such as methyl, ethyl, propyl, butyl, heptyl, hexyl, octyl, decyl, dodecyl, hexadecyl, octadecyl, 2-chloroethyl, 2-bromoethyl, 2-cyanoethyl, 2-methoxycarbonylethyl, 2-methoxyethyl or 3-bromopropyl), a 4–18C alkenyl group which may be substituted (such as 2-methyl-1-propenyl, 2-butenyl, 2-pentenyl, 3-methyl-2-pentenyl, 1-pentenyl, 1-hexenyl, 2-hexenyl or 4-methyl-2-hexenyl), a 7–12C aralkyl group which may be substituted (such as benzyl, phenetyl, 3-phenylpropyl, naphthylmethyl, 2-naphthylethyl, chlorobenzyl, bromobenzyl, methylbenzyl, ethylbenzyl, methoxybenzyl, dimethylbenzyl or dimethoxybenzyl), a 5–8C alicyclic group which may be substituted (such as cyclohexyl, 2-cyclohexylethyl or 2-cyclopentylethyl) and a 6–12C aromatic group which may be substituted (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propionamidophenyl or dodecyloylamidophenyl).

$a_1$ and $a_2$ in formula (V), which have the same meanings as $c_1$ and $c_2$ in formula (I) respectively, each represents a hydrogen atom, a halogen atom, a cyano group, a 1–8C hydrocarbon group, —COOZ' or a group having —COO—Z' via a hydrocarbon moiety (wherein Z' represents a hydrogen atom or a 1–18C hydrocarbon group which may be substituted). Preferably, either $a_1$ or $a_2$ represents a hydrogen atom.

Examples of a 1–7C hydrocarbon group represented by $R_5$, $R_6$, $R_7$ and $R_8$ each include methyl, ethyl, propyl, butyl, 2-chloroethyl, 2-methoxyethyl, 2-methoxycarbonylethyl, benzyl, methoxybenzyl, phenyl, methoxyphenyl and methoxycarbonylphenyl groups.

Examples of a monomer having an acid amide group represented by formula (IV) are illustrated below, but these examples should not be construed as limiting the scope of the invention.

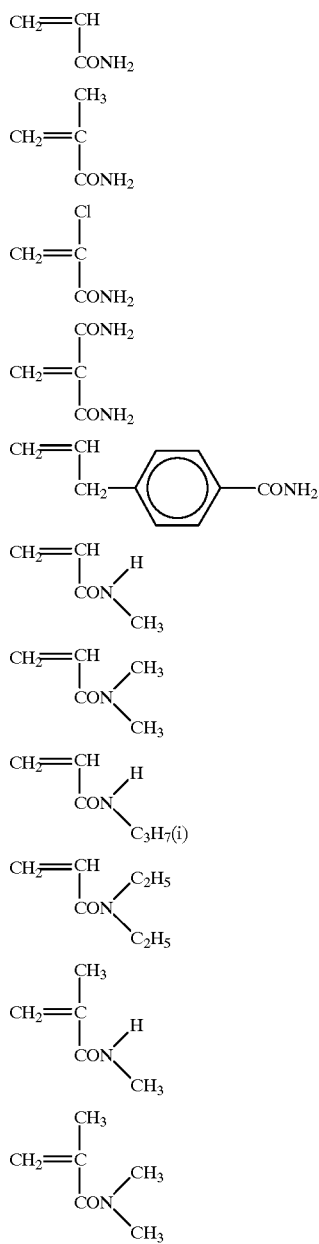

-continued

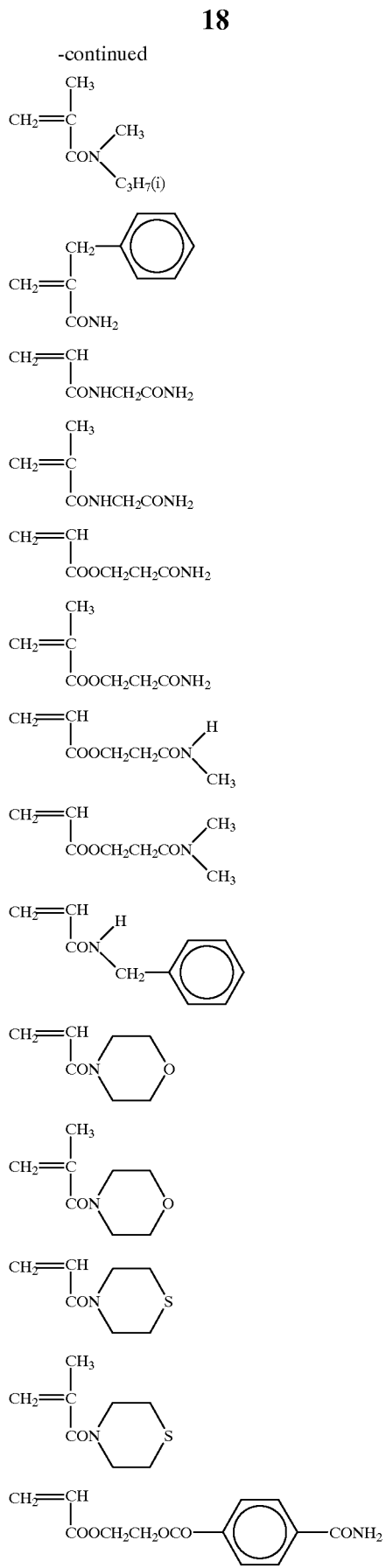

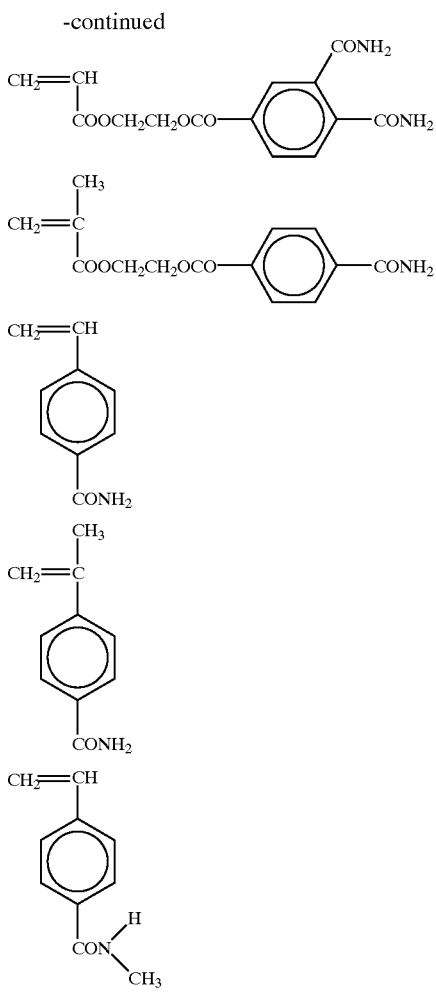

CH₂=CHCONHCH₂OH
CH₂=CHCONHCH₂OCH₃
CH₂=CHCONHCH₂COCH₃
CH₂=CHCONHCH₂CONH₂
CH₂=CHCONHCH(CH₃)CONH₂
CH₂=CHCONHCH₂CF₃
CH₂=CHCONHCH₂C₃F₇
CH₂=CHCONHCH₂CH₂OH
CH₂=CHCONHCH₂CH₂CN
CH₂=CHCONHCH₂CH₂N(CH₃)₂
CH₂=CHCONHCH₂CH₂CONH₂
CH₂=CHCONH(CH₂CH₂CONH)₂H
CH₂=CHCONHCOCH₃
(CH₂=CHCONH)₂CH₂
CH₂=CHCONHCOCH=CH₂
CH₂=CHCONHC(CH₃)₂CH₂COCH₃
CH₂=CHCONHCH₂CH₂SO₃Na
CH₂=CHCONHCH₂CH₂N(CH₃)₂
CH₂=CHCONHCOOCH₃
CH₂=CHCONHCOOC₂H₅
CH₂=CHCONHCOOCH(CH₃)₂
CH₂=CHCONHCOOC₄H₉
CH₂=CHCONHCOOCH(CH₃)C₂H₅
N-methylacrylamide
N-ethylacrylamide
N-propylacrylamide
N-isopropyl amide
N-allylacrylamide
N-n-butylacrylamide
N-t-butylacrylamide
N-n-heptylacrylamide
N-n-octylacrylamide
N-t-octylacrylamide
N-dodecylacrylamide
N-octadecylacrylamide
N-cyclohexylacrylamide
N-phenylmethylacrylamide
N-phenylethylacrylamide
N-α-naphthylacrylamide
N-β-naphthylacrylamide
N-p-anisylacrylamide
N-p-tolylacrylamide
N-o-tolylacrylamide
N-phenylacrylamide
N-p-chlorophenylacrylamide
N-m-chlorophenylacrylamide
N-p-nitrophenylacrylamide
N-p-β-chloroethylaminosulfonylacrylamide
N-methylmethacrylamide
N-ethylmethacrylamide
N-allylmethacryl amide
N-t-butylmethacrylamide
N-n-octylmethacrylamide
N-benzylmethacrylamide
N-cyclohexylmethacrylamide
N-2-naphthylmethacrylamide
N-o-anisylmethacrylamide
N-m-anisylmethacrylamide
N-p-anisylmethacrylamide
N-o-ethoxyphenylmethacrylamide
N-m-ethoxyphenylmethacrylamide
N-p-ethoxyphenylmethacrylamide
N-o-tolylmethacrylamide
N-m-tolylmethacrylamide
N-p-tolylmethacrylamide Of the compounds recited above, acrylamide, methacrylamide, α-benzylacrylamide, N-methylacrylamide, N-methylmethacrylamide, N-isopropylacrylamide and N-isopropylmethacrylamide are preferred over the others. In particular, acrylamide and methacrylamide are used to advantage.

The copolymer (A) used in the present invention comprises as constitutional repeating units the foregoing macromonomer (MB) [constituent (1)], a monomer represented by the foregoing formula (III) [constituent (2)], a quaternary ammonium salt monomer [constituent (3)] and a comonomer containing an acid amide group represented by the foregoing formula (IV) [constituent (4)], and the proportion of the constituent (1) to the constituent (2) to the constituent (3) to the constituent (4) in the copolymer (A) is (1–70)/(10–98)/(0.1–40)/(0.1–30) by weight, preferably (10–60)/(10–98)/(1–25)/(1–20) by weight.

Next the preparation of a macromonomer (MB) used for the synthesis of the present Copolymer (A) is illustrated using the following preparation examples.

PREPARATION EXAMPLE 1

Preparation of Macromonomer (M-1):

The mixture of 95 g of methylmethacrylate, 5 g of thioglycolic acid and 200 g of toluene was heated to 75° C. with stirring in a stream of nitrogen gas. Thereto was added 1.0 g of 2,2'-azobis(cyanovaleric acid) (abbreviated as "A.C.V."), and the reaction in the resultant mixture was run for 8 hours. Then, this reaction solution was admixed with 8 g of glycidylmethacrylate, 1.0 g of N,N-dimethyldodecylamine and 0.5 g of t-butylhydroquinone, and stirred for 12 hours at 100° C. After cooling, the resultant solution was poured into 2 liter of methanol to reprecipitate the reaction product. Thus, 82 g of a white powder was obtained as the intended macromonomer (M-1). The number-average molecular weight of (M-1) was 6,500, and the weight-average molecular weight thereof was 12,000.

PREPARATION EXAMPLE 2
Preparation of Macromonomer (M-2):

The mixture of 95 g of methylmethacrylate, 5 g of thioglycolic acid and 200 g of toluene was heated to 70° C. with stirring in a stream of nitrogen gas. Thereto was added 1.5 g of 2,2'-azobis(isobutyronitrile) (abbreviated as "A.I.B.N."), and the reaction in the resultant mixture was run for 8 hours. Then, this reaction solution was admixed with 7.5 g of glycidylmethacrylate, 1.0 g of N,N-dimethyldodecylamine and 0.8 g of t-butylhydroquinone, and stirred for 12 hours at 100° C. After cooling, the resultant solution was poured into 2 liter of methanol to reprecipitate the reaction product. Thus, 85 g of a colorless transparent viscous matter was obtained as the intended macromonomer (M-2). The number-average molecular weight of (M-2) was 2,400, and the weight-average molecular weight thereof was 6,000.

PREPARATION EXAMPLE 3
Preparation of Macromonomer (M-3):

The mixture of 94 g of propylmethacrylate, 6 g of 2-mercaptoethanol and 200 g of toluene was heated to 70° C. in a stream of nitrogen gas. Thereto was added 1.2 g of A.I.B.N., and the reaction in the resultant mixture was run for 8 hours.

Then, this reaction solution was cooled with a water bath to lower the temperature thereof to 20° C., and then admixed with 10.2 g of triethylamine. Thereto, 14.5 g of methacrylic acid chloride was further added dropwise with stirring as the temperature was kept below 25° C. After conclusion of the addition, the stirring was continued for additional one hour. Then, the resultant solution was admixed with 0.5 g of t-butylhydroquinone, heated to 60° C., and subjected to 4 hours' stirring. After cooling, the reaction solution was poured into 2 liter of methanol to reprecipitate the reaction product. Thus, 79 g of a colorless transparent viscous matter was obtained as the intended macromonomer (M-3). The number-average molecular weight of (M-3) was 4,500, and the weight-average molecular weight thereof was 9,200.

PREPARATION EXAMPLE 4
Preparation of Macromonomer (M-4):

The mixture of 95 g of ethylmethacrylate and 200 g of toluene was heated to 70° C. in a stream of nitrogen gas. Thereto was added 5 g of 2,2'-azobis(cyanoheptanol), and the reaction in the resultant mixture was run for 8 hours.

After cooling, the temperature of this reaction solution was adjusted to 20° C. with a water bath, and thereto were added 1.0 g of triethylamine and 21 g of methacrylic acid anhydride. The resultant solution was stirred for one hour, and further stirred for 6 hours at 60° C.

After cooling, the reaction solution was poured into 2 liter of methanol to reprecipitate the reaction product. Thus, 75 g of a colorless transparent viscous matter was obtained as the intended macromonomer (M-4). The number-average molecular weight of (M-4) was 6,200, and the weight-average molecular weight thereof was 12,100.

PREPARATION EXAMPLE 5
Preparation of Macromonomer (M-5):

The mixture of 93 g of benzylmethacrylate, 7 g of 6-mercaptopropionic acid, 170 g of toluene and 30 g of isopropanol was heated to 70° C. in a stream of nitrogen gas to prepare a homogeneous solution. Thereto was added 2.0 g of A.I.B.N., and the reaction in the resultant solution was run for 8 hours. After cooling, the reaction solution was poured into 2 liter of methanol for reprecipitation, and heated to 50° C. under reduced pressure to distill away the solvents. The thus obtained viscous matter was dissolved in 200 g of toluene, and thereto were added 16 g of glycidylmethacrylate, 1.0 g of N,N-dimethyldodecylmethacrylate and 1.0 g of t-butylhydroquinone. The resultant mixture was stirred for 10 hours at 110° C., and then poured into 2 liter of methanol to reprecipitate the reaction product. The thus obtained light yellow viscous matter as the intended macromonomer (M-5) had a number-average molecular weight of 3,400 and a weight-average molecular weight of 7,500.

PREPARATION EXAMPLE 6
Preparation of Macromonomer (M-6):

The mixture of 95 g of propylmethacrylate, 5 g of thioglycolic acid and 200 g of toluene was heated to 70° C. with stirring in a stream of nitrogen gas. Thereto was added 1.0 g of A.I.B.N., and the reaction in the resultant mixture was run for 8 hours. Then, this reaction solution was admixed with 13 g of glycidylmethacrylate, 1.0 g of N,N-dimethyldodecylamine and 1.0 g of t-butylhydroquinone, and stirred for 10 hours at 110° C. After cooling, the resultant solution was poured into 2 liter of methanol to reprecipitate the reaction product. Thus, 86 g of a white powder was obtained as the intended macromonomer (M-6). The number-average molecular weight of (M-6) was 3,500, and the weight-average molecular weight thereof was 8,200.

PREPARATION EXAMPLE 7
Preparation of Macromonomer (M-7):

The mixture of 40 g of methylmethacrylate, 54 g of ethylmethacrylate, 6 g of 2-mercaptoethylamine, 150 g of toluene and 50 g of tetrahydrofuran was heated to 75° C. with stirring in a stream of nitrogen gas. Thereto was added 2.0 g of A.I.B.N., and the reaction in the resultant mixture was run for 8 hours. Then, this reaction solution was cooled with a water bath to lower the temperature thereof to 20° C. and thereto, 23 g of methacrylic acid anhydride was added dropwise as the temperature was kept below 25° C. After conclusion of the addition, the stirring was continued for additional one hour. Then, the resultant solution was admixed with 0.5 g of 2,2'-methylenebis(6-t-butyl-p-cresol), and stirred for 3 hours at 40° C. After cooling, the reaction solution was poured into 2 liter of methanol to reprecipitate the reaction product. Thus, 83 g of a viscous matter was obtained as the intended macromonomer (M-7). The number-average molecular weight of (M-7) was 2,200, and the weight-average molecular weight thereof was 4,900.

PREPARATION EXAMPLES 8 to 12
Preparation of Macromonomers (M-8) to (M-12):

Macromonomers (M-8) to (M-12) were each prepared in the same manner as in Preparation Example 2, except that the methylmethacrylate was replaced by the monomer(s) as set forth in Table 1. In Table 1, Mn stands for the number-average molecular weight, and Mw stands for the weight-average molecular weight.

TABLE 1

| Macro-monomer | Monomer | Amount used | Mn | Mw |
|---|---|---|---|---|
| M-8 | Ethylmethacrylate | 95 g | 2,800 | 5,900 |
| M-9 | Methylmethacrylate | 60 g | 3,200 | 6,900 |
| | Butylmethacrylate | 35 g | | |
| M-10 | Butylmethacrylate | 85 g | 3,300 | 6,500 |
| | 2-Hydroxyethylmethacrylate | 10 g | | |
| M-11 | Ethylmethacrylate | 75 g | 2,200 | 5,500 |
| | Styrene | 20 g | | |
| M-12 | Methylmethacrylate | 80 g | 2,500 | 5,100 |
| | Methylacrylate | 15 g | | |

Synthesis examples of a copolymer (A) used in the present invention are described below.

SYNTHESIS EXAMPLE 1
Synthesis of Copolymer [A-1]:

The mixture of 35 g of benzylmethacrylate, 50 g of Macromonomer (M-1), 5 g of acrylamide, 10 g of dimethylaminoethylmethacrylate and 200 g of propylene glycol monomethylether acetate was heated to 75° C. in a stream of nitrogen, and thereto was added 1.2 g of A.I.B.N. Under this condition the reaction was run for 6 hours to obtain a copolymer. Thereto was added 12.86 g of methyl p-toluenesulfonate, and the methylation reaction was run for 2 hours to convert the copolymer into the quaternary salt. The thus obtained Copolymer [A-1] had a weight-average molecular weight of $8.0 \times 10^4$.

SYNTHESIS EXAMPLES 2 TO 22
Syntheses of Copolymers [A-2] to [A-22]:

Copolymers [A-2] to [A-22] were synthesized using the compositions set forth in Table 2 under the same polymerization condition as in Synthesis Example 1. In each of the syntheses of Copolymers [A-2] to [A-21], the polymerized product was converted into the quaternary salt by the use of methyl p-toluenesulfonate in the amount equimolar with the tertiary amine monomer; while, in the synthesis of Copolymer [A-22], the polymerized product was converted into the quaternary salt by bubbling methyl chloride through the polymerized product solution. The thus obtained Copolymers [A-2] to [A-22] had their respective weight-average molecular weights in the range of $5 \times 10^4$ to $1 \times 10^5$.

TABLE 2

| Copolymer Sample | Acrylamide | Tertiary amine monomer* | Comonomer | Macromonomer |
|---|---|---|---|---|
| A - 2 | acrylamide 5 g | dimethylaminoethyl methacrylate 5 g | benzyl methacrylate 40 g | Macromonomer (M-1) 50 g |
| A - 3 | acrylamide 5 g | diethylaminoethyl methacrylate 10 g | benzyl methacrylate 35 g | Macromonomer (M-1) 50 g |
| A - 4 | methacrylamide 5 g | diethylaminoethyl methacrylate 5 g | benzyl methacrylate 40 g | Macromonomer (M-1) 50 g |
| A - 5 | dimethylacrylamide 5 g | dimethylaminoethyl methacrylate 10 g | benzyl methacrylate 35 g | Macromonomer (M-1) 50 g |
| A - 6 | acrylamide 5 g | dimethylaminoethyl methacrylate 10 g | benzyl methacrylate 35 g | Macromonomer (M-3) 50 g |
| A - 7 | acrylamide 5 g | dimethylaminoethyl methacrylate 10 g | benzyl methacrylate 35 g | Macromonomer (M-5) 50 g |
| A - 8 | acrylamide 5 g | dimethylaminoethyl methacrylate 10 g | benzyl methacrylate 35 g | Macromonomer (M-7) 50 g |
| A - 9 | acrylamide 5 g | dimethylaminoethyl methacrylate 10 g | benzyl methacrylate 35 g | Macromonomer (M-9) 50 g |
| A - 10 | acrylamide 5 g | dimethylaminoethyl methacrylate 10 g | benzyl methacrylate 35 g | Macromonomer (M-11) 50 g |
| A - 11 | acrylamide 5 g | dimethylaminoethyl methacrylate 10 g | benzyl methacrylate 35 g | AS-6 50 g |
| A - 12 | N-ethylacrylamide 5 g | dimethylaminoethyl methacrylate 10 g | benzyl methacrylate 35 g | Macromonomer (M-1) 50 g |
| A - 13 | N-propylacrylamide 5 g | dimethylaminoethyl methacrylate 10 g | benzyl methacrylate 35 g | Macromonomer (M-1) 50 g |
| A - 14 | acrylamide 5 g | diethylaminoethyl methacrylate 10 g | methyl methacrylate 35 g | Macromonomer (M-1) 50 g |
| A - 15 | methacrylamide 5 g | diethylaminoethyl methacrylate 5 g | methyl methacrylate 40 g | Macromonomer (M-1) 50 g |
| A - 16 | dimethylacrylamide 5 g | dimethylaminoethyl methacrylate 10 g | methyl methacrylate 35 g | Macromonomer (M-1) 50 g |
| A - 17 | acrylamide 5 g | dimethylaminoethyl methacrylate 10 g | methyl methacrylate 35 g | Macromonomer (M-3) 50 g |
| A - 18 | acrylamide 5 g | diethylaminoethyl methacrylate 10 g | ethyl methacrylate 35 g | Macromonomer (M-1) 50 g |
| A - 19 | methacrylamide 5 g | diethylaminoethyl methacrylate 5 g | ethyl methacrylate 40 g | Macromonomer (M-1) 50 g |
| A - 20 | acrylamide 5 g | dimethylaminoethyl methacrylate 10 g | methyl methacrylate 35 g | AS-6 50 g |
| A - 21 | methacrylamide 5 g | dimethylaminoethyl methacrylate 5 g | methyl methacrylate 40 g | AA-6 50 g |
| A - 22 | acrylamide 5 g | dimethylaminoethyl methacrylate 10 g | benzyl methacrylate 35 g | AB-6 50 g |

*precursor of quaternary ammonium salt monomer

Additionally, the macromonomers AA-6, AS-6 and AB-6 in the above table are methylmethacrylate macromonomer, styrene macromonomer and butylmethacrylate macromonomer respectively, which are the products of Toagosei Co., Ltd. and each has a number-average molecular weight of 6,000.

The present graft copolymer is used in a proportion of from 0.1 to 100 weight %, preferably from 2 to 50 weight %, to a pigment as the component (C), and from 0.01 to 60 weight %, preferably from 0.5 to 30 weight %, to the total solids in the radiation sensitive colored composition.

Next the radiation sensitive compounds which can be used for the present composition are illustrated below.

In the present invention, any of compounds hitherto known to be sensitive to radiations can be employed as a radiation sensitive compound.

The radiation sensitive compound used in the present invention is preferably a combination of (1) a compound containing at least one addition-polymerizable ethylenic unsaturated group and having a boiling point of not lower than 100° C. under ordinary pressure with (2) a combination of at least one active halogen compound chosen from halomethyloxadiazole compounds or halomethyl-s-triazine compounds and a coumarin compound having an aryl substituent at the 3-position, or/and (3) at least one lophine dimer.

Herein, the combination (2) and the compound (3) are photopolymerization initiators, and they have a function to polymerize the monomer (1) upon exposure to light.

Specific examples of a monomer (1), namely a compound containing at least one addition-polymerizable ethylenic unsaturated group and having a boiling point of not lower than 100° C. under ordinary pressure, include monofunctional acrylates and methtacrylates, such as polyethylene glycol mono(meth)acrylate, polypropylene glycol mono(meth)acrylate and phenoxyethyl(meth)acrylate; the products prepared by adding ethylene oxide or propylene oxide to polyfunctional alcohols, such as polyethylene glycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol hexa(meth)acrylate, hexanediol (meth)acrylate, trimethylolpropane tri(acryloyloxypropyl)ether, tri(acryloyloxyethyl) isocyanurate, glycerine and trimethylolethane, and then (meth)acrylating the addition products; the urethane acrylates described in JP-B-48-41708, JP-B-50-6034 and JP-A-51-37193; the polyester acrylates described in JP-A-48-64183, JP-B-49-43191 and JP-B-52-30490; and polyfunctional acrylates and methacrylates, such as epoxy(meth)acrylates as the reaction products of epoxy resins and (meth)acrylic acid. Further, the photosetting monomers and oligomers described in *Nippon Settyaky-Kyokai-Shi*, Vol. 20, No. 7, pp. 300–308, can be used as the monomer (1). Such a radiation-polymerizable monomer or oligomer can be used in an arbitrary proportion so far as the present composition can form a coating having adhesiveness when irradiated with radiations and the objects and advantages of the present invention are not marred thereby. The suitable proportion of the monomer or oligomer used is from 5 to 90 weight %, preferably from 10 to 50 weight %, to the total solid ingredients in the radiation sensitive colored composition.

As examples of an active halogen compound, such as a halomethyloxadiazole or a halomethyl-s-triazine, which comprises the combination (2), mention may be made of the 2-halomethyl-5-vinyl-1,3,4-oxadiazole compounds described in JP-B-57-6096, which are represented by the following formula I:

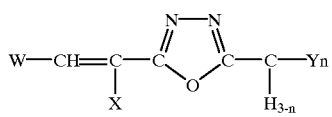

Formula I wherein W represents a substituted or unsubstituted aryl group; X represents a hydrogen atom, an alkyl group or an aryl group; Y represents a fluorine atom, a chlorine atom or a bromine atom; and n represents an integer of 1 to 3.

Specific examples of such a compound include 2-trichloromethyl-5-styryl-1,3,4-oxadiazole, 2-trichloromethyl-5-(p-cyanostyryl)-1,3,4-oxadiazole and 2-trichloromethyl-5-(p-methoxystyryl)-1,3,4-oxadiazole.

As examples of a halomethyl-s-triazine compound as a photopolymerization initiator, mention may be made of the vinyl-halomethyl-s-triazine compounds described in JP-B-59-1281, which are represented by the following formula II; and the compounds described in JP-A-53-133428, specifically 2-(naphtho-1-yl)-4,6-bis-halomethyl-s-triazine compounds represented by the following formula III and the 4-(p-aminophenyl)-2,6-dihalomethyl-s-triazine compounds represented by the following formula IV:

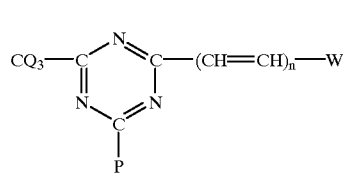

Formula II wherein $Q_3$ is Br or Cl; and P represents —$CQ_3$, —$NH_2$, —NHR, —$N(R)_2$ or —OR (wherein R is a phenyl or alkyl group); W represents an optionally substituted aromatic or heterocyclic nucleus, or a group of the following formula IIA wherein Z is —O— or —S—:

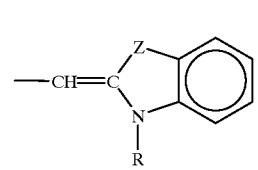

Formula IIA

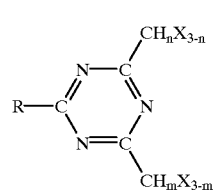

Formula III wherein X is Br or Cl, m and n are each an integer of 0 to 3, R is a group represented by the following formula IIIA (wherein $R_1$ is H or OR, R is an alkyl, a cycloalkyl group, an alkenyl group or an aryl group, and $R_2$ is Cl, Br, an alkyl group, an alkenyl group, an aryl group or an alkoxy group);

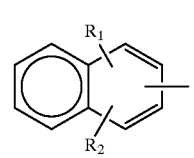

Formula IIIA

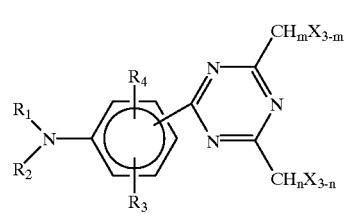

Formula IV wherein $R_1$ and $R_2$ are each —H, an alkyl group, a substituted alkyl group, an aryl group, a substituted aryl group, a group of the following formula IVA or a group of the following formula IVB; $R_3$ and $R_4$ are each —H, a halogen atom, an alkyl group or an alkoxy group; X is —Cl or —Br; and m and n are each 0, 1 or 2:

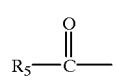

Formula IVA

-continued

Formula IVB

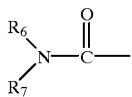

wherein $R_5$, $R_6$ and $R_7$ are each an alkyl group, a substituted alkyl group, an aryl group or a substituted aryl group.

As the examples of the substituents for the foregoing substituted alkyl and aryl groups, an aryl group such as phenyl, a halogen atom, an alkoxy group, a carboalkoxy group, a carboaryloxy group, an acyl group, a nitro group, a dialkylamino group and a sulfonyl derivative are examples thereof.

When $R_1$ and $R_2$ in formula IV form a hetero ring composed of non-metallic atoms together with the nitrogen atom, such a hetero ring includes the following ones:

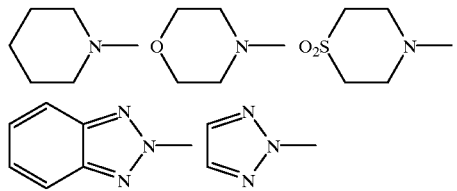

Specific examples of a compound of formula II include 2,4-bis(trichloromethyl)-6-p-methoxystyryl-s-triazine, 2,4-bis(trichloromethyl)-6-(1-p-dimethylaminophenyl-1,3-butadienyl)-s-triazine and 2-trichloromethyl-4-amino-6-p-methoxystyryl-s-triazine.

Specific examples of a compound of formula III include 2-(naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine and 2-(4,5-dimethoxy-naphtho-1-yl)-4,6-bis-trichloromethyl-s-triazine.

Specific examples of a compound of formula IV include 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloromethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine and 4-(o-fluoro-p-N-chloroethylaminophenyl)-2,6-di(trichloromethyl)-s-triazine.

Those initiators can be used together with sensitizers as recited below.

Specific examples of such a sensitizer include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenyl styryl ketone, p-(dimethylamino)phenyl p-methylstyryl ketone, benzophenone, p-(dimethylamino)benzophenone (or Michler's ketone), p-(diethylamino)benzophenone, benzanthrone, and the benzothiazole compounds described in JP-B-51-48516.

The term coumarin compound having an aryl substituent at the 3-position refers to a compound represented by formula V illustrated below.

In formula V, $R_8$ represents a hydrogen atom, a 1–8C alkyl group, a 6–10C aryl group, preferably a hydrogen atom, a methyl group, an ethyl group, a propyl group or a butyl group; and $R_9$ represents a hydrogen atom, a 1–8C alkyl group, a 6–10C aryl group, a group represented by formula VA illustrated below, preferably a methyl group, an ethyl group, a propyl group, a butyl group or a group represented by formula VA, particularly preferably a group represented by formula VA.

$R_{10}$ and $R_{11}$ each represent a hydrogen atom, a 1–8C alkyl group (e.g., methyl, ethyl, propyl, butyl, octyl), a 1–8C haloalkyl group (e.g., chloromethyl, fluoromethyl, trifluoromethyl), a 1–8C alkoxy group (e.g., methoxy, ethoxy, butoxy), an optionally substituted 6–10C aryl group (e.g., phenyl), an amino group, —$N(R_{16})(R_{17})$ or halogen (e.g., —Cl, —Br, —F). Preferably, they are each a hydrogen atom, a methyl group, an ethyl group, a methoxy group, a phenyl group, —$N(R_{16})(R_{17})$ or —Cl.

$R_{12}$ represents a 6–16C aryl group (e.g., phenyl, naphthyl, tolyl, cumyl), which may have a substituent. As for the substituent, an amino group, —$N(R_{16})(R_{17})$, a 1–8C alkyl group (e.g., methyl, ethyl, propyl, butyl, octyl), a 1–8C haloalkyl group (e.g., chloromethyl, fluoromethyl, trifluoromethyl), a 1–8C alkoxy group (e.g., methoxy, ethoxy, butoxy), a hydroxyl group, a cyano group and halogen (e.g., —Cl, —Br, —F) are examples thereof.

$R_{13}$, $R_{14}$, $R_{16}$ and $R_{17}$ each represent a hydrogen atom or a 1–8C alkyl group (e.g., methyl, ethyl, propyl, butyl, octyl). Further, $R_{13}$ and $R_{14}$ may be combined and $R_{16}$ and $R_{17}$ may be combined, and thereby complete nitrogen-containing hetero rings respectively. Specific examples of such a hetero ring include a piperidine ring, a piperazine ring, a morpholine ring, a pyrazole ring, a diazole ring, a triazole ring and a benzotriazole ring.

$R_{15}$ represents a hydrogen atom, a 1–8C alkyl group (e.g., methyl, ethyl, propyl, butyl, octyl), a 1–8C alkoxy group (e.g., methoxy, ethoxy, butoxy), an optionally substituted 6–10C aryl group (e.g., phenyl), an amino group, —$N(R_{16})(R_{17})$ or halogen (e.g., —Cl, —Br, —F).

Zb represents =O, =S or =$C(R_{18})(R_{19})$, preferably =O, =S or =$C(CN)_2$, particularly preferably =O.

$R_{18}$ and $R_{19}$ each represent a cyano group, —$COOR_{20}$ or —$COR_{21}$. $R_{20}$ and $R_{21}$ are each a 1–8C alkyl group (e.g., methyl, ethyl, propyl, butyl, octyl), a 1–8C haloalkyl group (e.g., chloromethyl, fluoromethyl, trifluoromethyl) or an optionally substituted 6–10C aryl group (e.g., phenyl).

Of the 3-arylcoumarin compounds mentioned above, the {(s-triazine-2-yl)amino}-3-arylcoumarin compounds represented by the following formula VI are especially preferred over the others.

Formula V

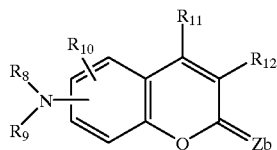

Formula VA

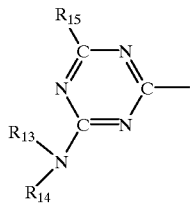

Formula VI

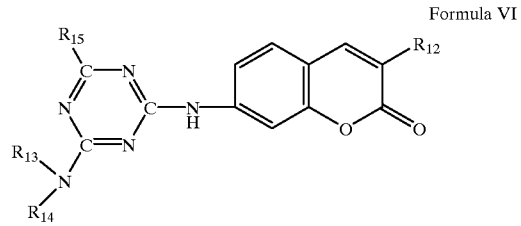

The term lophine dimer (3) refers to a 2,4,5-triphenylimidazolyl dimer consisting of two lophine residues, and the basic structure thereof is illustrated below:

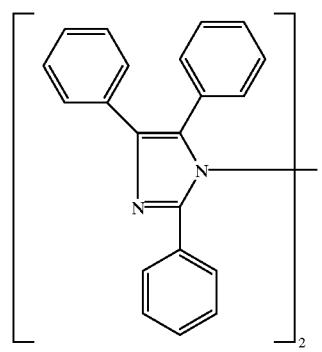

Specific examples of a lophine dimer include 2-(o-chlorophenyl)-4.5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(2,4-dimethoxyphenyl)-4,5-diphenylimidazolyl dimer and 2-(p-methylmercaptophenyl)-4,5-diphenylimidazolyl dimer.

Besides the initiators recited above, other known initiators can also be used in the present invention.

Examples of a known initiator usable in the present invention include the vicinal polyketolaldonyl compounds disclosed in U.S. Pat. 2,367,660, the α-carbonyl compounds disclosed in U.S. Pat. Nos. 2,367,661 and 2,367,670, the acyloin ethers disclosed in U.S. Pat. No. 2,448,828, the α-hydrocarbon-substituted aromatic acyloin compounds disclosed in U.S. Pat. No. 2,722,512, the polynuclear quinones disclosed in U.S. Pat. Nos. 3,046,127 and 2,951,758, the combination of triallylimidazole dimer and p-aminophenyl ketone disclosed in U.S. Pat. No. 3,549,367, and the combination of a benzothiazole compound and a trihalomethyl-s-triazine compound disclosed in JP-B-51-48516.

The initiators are used in a proportion of from 0.01 to 50 weight %, preferably from 1 to 20 weight %, to the monomers used. When the proportion is less than 0.01 weight %, it is hard to promote the polymerization. When the proportion is increased beyond 50 weight %, on the other hand, the rate of polymerization is raised but the molecular weight of the polymer obtained becomes low to cause a decrease in strength of the polymer film.

Next the pigment serving as the component (C) of the present composition is illustrated below.

As for the pigment (C) which can be used in the present invention, hitherto known various inorganic and organic pigments, carbon black and aniline black are examples thereof.

Such inorganic pigments are metallic compounds, including metal oxides and metal complex salts. More specifically, oxides of metals, such as iron, cobalt, aluminum, cadmium, lead, copper, titanium, magnesium, chromium, zinc and antimony, and compound oxides of those metals are suitable examples of the inorganic pigment.

As suitable examples of an organic pigment, mention may be made of:

C.I. Pigment Yellow 11, 24, 31, 53, 83, 99, 108, 109, 110, 138, 139, 151, 154, 167, 185;

C.I. Pigment Orange 36, 38, 43;

C.I. Pigment Red 105, 122, 149, 150, 155, 171, 175, 176, 177, 209, 224, 254, 255;

C.I. Pigment Violet 19, 23, 32, 39;

C.I. Pigment Blue 1, 2, 15:1, 15:2, 15:3, 15:6, 16, 22, 60, 66;

C.I. Pigment Green 7, 36, 37;

C.I. Pigment Brown 25, 28; and

C.I. Pigment Black 1, 7.

Also, carbon black is a favorable pigment for the present composition.

As the preferred pigments, those shown below are recited, but those should not be construed as limiting the scope of the invention.

C.I. Pigment Yellow 11

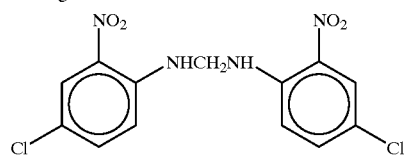

C.I. Pigment Yellow 24

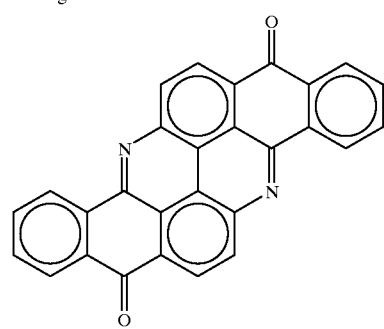

C.I. Pigment Yellow 108

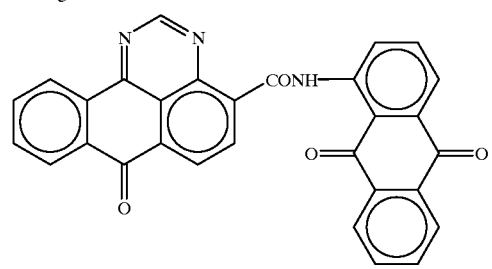

-continued

C.I. Pigment Yellow 109

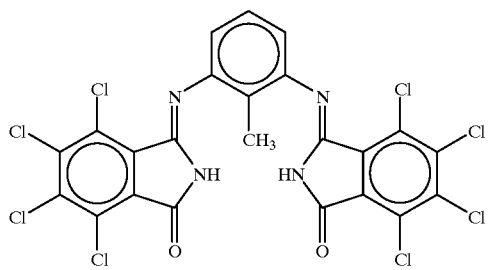

C.I. Pigment Yellow 110

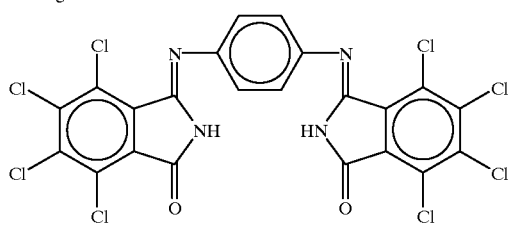

C.I. Pigment Yellow 138

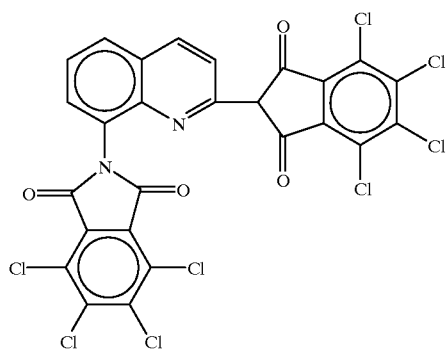

C.I. Pigment Yellow 139

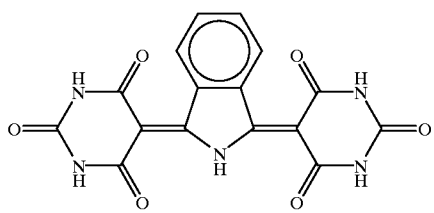

C.I. Pigment Yellow 150

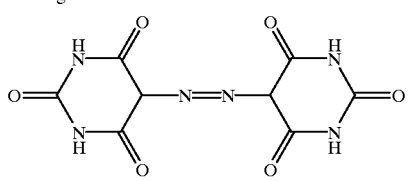

C.I. Pigment Yellow 151
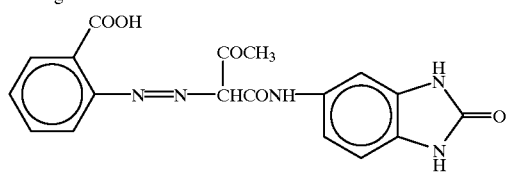
C.I. Pigment Yellow 154
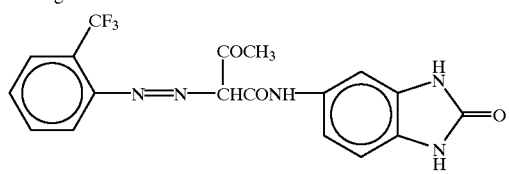
C.I. Pigment Yellow 167
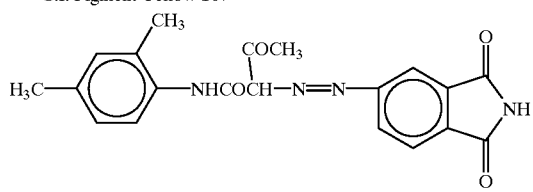
C.I. Pigment Yellow 185
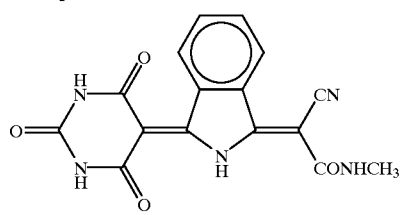
C.I. Pigment Orange 36
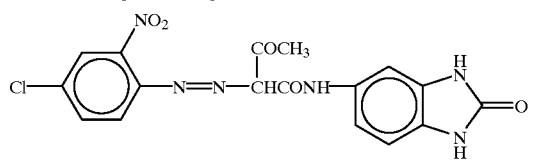
C.I. Pigment Red 122
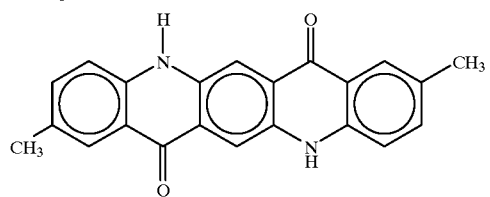
C.I. Pigment Red 150
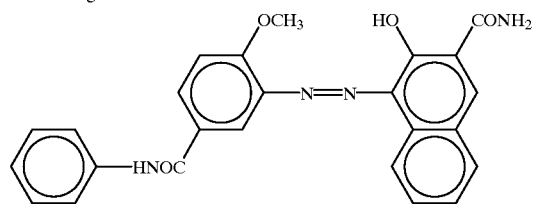
C.I. Pigment Red 171
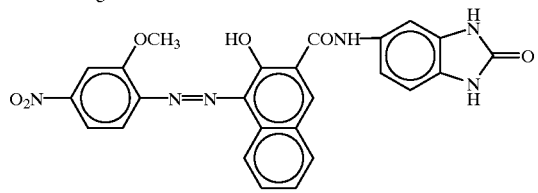
C.I. Pigment Red 175
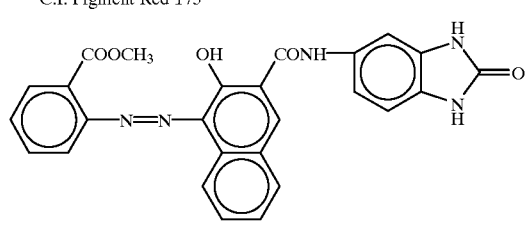
C.I. Pigment Red 177
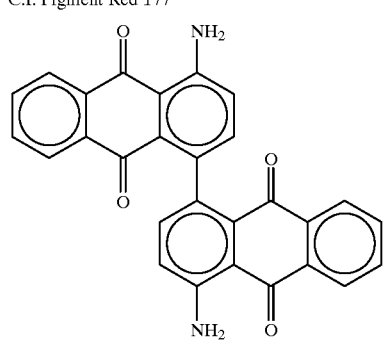
C.I. Pigment Red 209
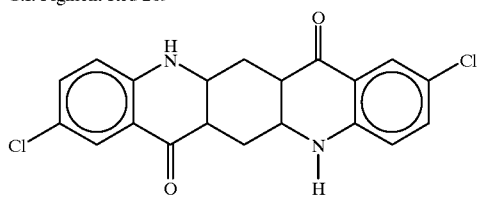
C.I. Pigment Violet 19
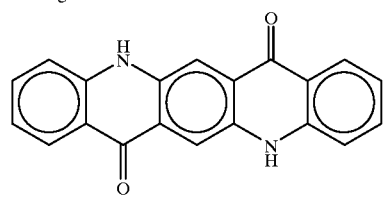
C.I. Pigment Violet 32
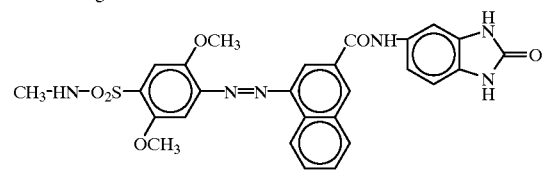

-continued

C.I. Pigment Blue 15

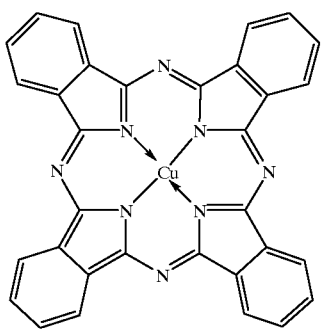

C.I. Pigment Blue 16

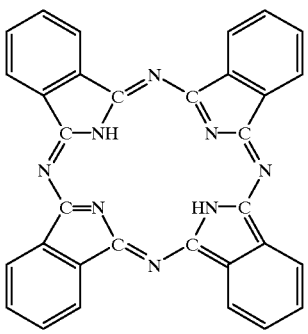

C.I. Pigment Blue 22

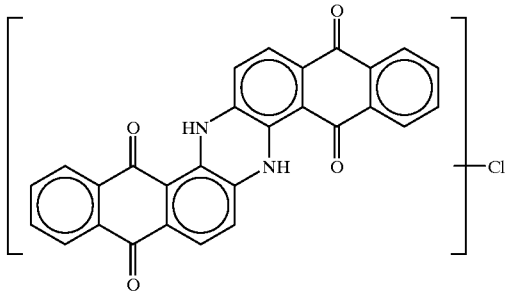

C.I. Pigment Blue 66

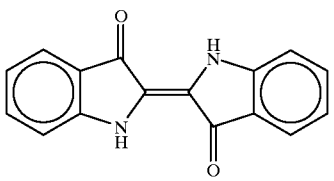

C.I. Pigment Black 1

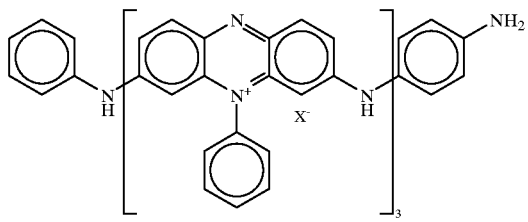

X: copper-chromium complex

Of the pigments illustrated above, P.Y. 139, P.Y. 185 or P.Y. 150 is used to particular advantage.

However, the pigments which can be used in the present invention should not be construed as being limited to the isoindoline or isoindolinone pigments recited above.

Those pigments are dried in various manners after they are produced. In general they are produced in a state of aqueous dispersion, and pulverized via evaporation to dryness. In order to obtain a pulverized pigment via drying, great thermal energy is applied to the pigment dispersion since water requires great latent heat for drying through evaporation.

As a result of it, primary grains of such a pulverized pigment usually gather together to form an aggregate (secondary grains).

The pigments obtained in the form of aggregate are difficult to disperse finely. Therefore, it is desirable that the pigments be treated with various resins prior to pulverization.

Examples of a resin usable for such a pretreatment include the present graft copolymers.

The pretreatment described above can be effected by adopting a flushing treatment or a kneading method using a kneader, an extruder, a ball mill or a two-rod or three-rod roll mill. Of these methods, the flushing treatment and the kneading method using a two-rod or three-rod roll mill are preferred over the other methods with respect to the fineness of pigment grains obtained.

The flushing treatment is a method which generally comprises mixing an aqueous dispersion of pigment with a solution of resin dissolved in a water-immiscible solvent and extracting the pigment from the water medium into the organic medium, thereby treating the pigment with the resin in the organic medium. According to this method, the pigment undergoes no drying step, so that the aggregation of pigment grains can be prevented to make it easy to finely disperse the pigment.

The kneading method using a two-rod or three-rod roll mill is a method of treating a pigment with a resin so as to coat the pigment surface with the resin by mixing the pigment with the resin or a solution of resin and further kneading the mixture as a high shearing stress is applied thereto.

Also, processed pigments, such as pigments previously treated with an acrylic resin, a vinyl chloride-vinyl acetate copolymer resin, a maleic acid resin, an ethyl cellulose resin and a nitrocellulose resin respectively, can be used to advantage in the present invention.

It is desirable that the pigments treated with the present graft copolymers or various resins as recited above, namely processed pigments, have a form of powder, paste or pellet wherein a resin and a pigment are homogeneously dispersed. On the other hand, it is undesirable for the processed pigments to have a form of heterogeneous conglomerate via the gelation of resins.

The aforementioned organic pigments are used independently, or in combination with various pigments for elevating the color purity.

As for red pigments, anthraquinone pigments or perylene pigments are used alone or in combination with disazo yellow pigments or isoindoline yellow pigments. For instance, C.I. Pigment Red 177 is used as an anthraquinone pigment, and C.I. Pigment Red 155 is used as a perylene pigment. In view of the color reproduction, it is desirable that each of these red pigments be mixed with C.I. Pigment Yellow 83, C.I. Pigment Yellow 139, C.I. Pigment Yellow 150, C.I. Pigment Yellow 185, C.I. Pigment Yellow 110 or C.I. Pigment Yellow 109. The suitable ratio of a red pigment to a yellow pigment is from 100:5 to 100:50 by weight.

When the ratio is 100:4 or below, the combination of such pigments cannot suppress the transmission of light in the wavelength range of 400 to 500 nm to fail in elevating the color purity. When the ratio is 100:51 or above, on the other hand, the principal wavelength is shifted to a shorter wave length to result in a great deviation from the NTSC guide hue. Thus, the ratio ranging from 100:10 to 100:30 by weight can attain the optimum color reproduction.

As for green pigments, halogenated phthalocyanine pigments are used alone or in combination with disazo yellow pigments or isoindoline yellow-pigments. Specifically, it is desirable that C.I. Pigment Green 7, 36 or 37 as a halogenated phthalocyanine pigment be used as a mixture with C.I. Pigment Yellow 83, C.I. Pigment Yellow 139, C.I. Pigment Yellow 150, C.I. Pigment Yellow 185, C.I. Pigment Yellow 110 or C.I. Pigment Yellow 109. The suitable ratio of a green pigment to a yellow pigment is from 100:5 to 100:40 by weight. When the ratio is 100:4 or below, the mixture of such pigments cannot suppress the transmission of light in the wavelength range of 400 to 450 nm to fail in elevating the color purity. When the ratio is 100:41 or above, on the other hand, the principal wavelength is shifted to a longer wave length to result in a great deviation from the NTSC guide hue. Thus, the ratio ranging from 100:5 to 100:20 by weight is most appropriate for the color reproduction.

As mentioned above, the red pigments and the green pigments are used together with yellow pigments. When the dispersibility of a yellow pigment is poor, therefore, color filters having sufficient transparency cannot be obtained.

As for blue pigments, phthalocyanine pigments are used alone or in combination with dioxazine violet pigments. For instance, it is desirable that C.I. Pigment Blue 15:3 or C.I. Pigment Blue 15:6 be used as the mixture with C.I. Pigment Violet 23. The suitable ratio of a blue pigment to a violet pigment is from 100:5 to 100:50 by weight. When the ratio is 100:4 or below, the mixture of such pigments cannot suppress the transmission of light in the wavelength range of 400 to 420 nm to fail in elevating the color purity. When the ratio is 100:51 or above, on the other hand, the principal wavelength is shifted to a longer wave length to result in a great deviation from the NTSC guide hue. Thus, the ratio ranging from 100:5 to 100:20 by weight is most appropriate for the color reproduction.

Further, powdery processed pigments prepared by finely dispersing the foregoing pigments into an acrylic resin, a maleic acid resin, a vinyl chloride-vinyl acetate copolymer resin, an ethylcellulose resin or the like can be used for ensuring excellent dispersibility and dispersion stability for the pigment-containing photosensitive resins.

As for pigments for black matrix use, carbon, titanium carbon and iron oxides are examples thereof. They can be used alone or as a mixture of two or more thereof. Preferably, carbon and titanium carbon are used in combination. The suitable ratio of carbon to titanium carbon is from 100:5 to 100:40 by weight. When the ratio is 100:4 or below, the transmittance of light at long wave lengths becomes high; while, when the ratio is 100:41 or above, the dispersion stability becomes poor.

The pigment of each color is used in a proportion of 5 to 80 weight % to the total solid ingredients in the radiation sensitive colored composition. When the proportion is less than 5 weight %, a practical problem is caused thereby since the coating of the present composition is required to have a thickness of at least 10 μm for obtaining sufficiently high color purity; while, when the proportion is increased beyond 80 weight %, scumming or the coating residue tends to generate in the non-image area. Thus, the suitable proportion is from 10 to 60 weight %.

In a radiation sensitive colored composition according to the present invention, an alkali-soluble resin can be used as a binding resin in combination with the present graft copolymer as defined hereinbefore.

The alkali-soluble resins suitable for such a binding resin are linear organic high polymers soluble in organic solvents and developable with an aqueous solution of weak alkali. As examples of such a linear organic high polymer, mention may be made of the polymers having carboxylic acid groups in their side chains as described, e.g., in JP-A-59-44615, JP-B-54-34327, JP-B-58-12577, JP-B-54-25957, JP-A-59-53836 and JP-A-59-71048, including methacrylic acid copolymers, acrylic acid copolymers, itaconic acid copolymers, crotonic acid copolymers, maleic acid copolymers and partially esterified maleic acid copolymers; and further, acidic cellulose derivatives having carboxylic acid groups in their side chains. In addition, the polymers prepared by addition of acid anhydrides to hydroxyl group-containing polymers are also useful. Of those polymers, a copolymer of benzyl(meth)acrylate and (meth)acrylic acid and a plural copolymer of benzyl(meth)acrylate, (meth) acrylic acid and other monomers are favorable over the others. In addition to those polymers, water-soluble polymers such as poly(2-hydroxyethylmethacrylate), polyvinyl pyrrolidone, polyethylene oxide and polyvinyl alcohol are also useful. Further, an alcohol-soluble nylon, a polyether of 2,2-bis(4-hydroxyphenyl)propane and epichlorohydrin, and the like are useful for heightening the strength of the cured coating, too.

Other suitable binding resins include the copolymers described in JP-A-07-140654, such as the copolymer of 2-hydroxypropyl(meth)acrylate, polystyrene macromonomer, benzylmethacrylate and methacrylic acid, the copolymer of 2-hydroxy-3-phenoxypropylacrylate, polymethylmethacrylate macromonomer, benzylmethacrylate and methacrylic acid, the copolymer of 2-hydroxyethylmethacrylate, polystyrene macromonomer, methylmethacrylate and methacrylic acid, and the copolymer of 2-hydroxyethylmethacrylate, polystyrene macromonomer, benzylmethacrylate and methacrylic acid.

The ratio of the present graft Copolymer (A) to the above-recited resins usable in combination therewith is from 0.1:99.9 to 90:10, preferably from 1:99 to 80:20, more preferably from 5:95 to 50:50, by weight. In a case of developing the present composition with an alkali, the use of alkali-soluble resins in a higher proportion can produce the better results.

To the present composition, various additives, e.g., fillers, polymer compounds other than the resins recited hereinbefore, surfactants, adhesion accelerators, antioxidants, ultraviolet absorbents and aggregation inhibitors, can be added, if desired.

Specific examples of such additives include fillers such as glass and alumina; polymer compounds other than the aforementioned component (A), such as polyvinyl alcohol, polyacrylic acid, polyethylene glycol monoalkyl ethers and polyfluoroalkylacrylate; nonionic, cationic and anionic surfactants; adhesion accelerators, such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropylmethoxysilane and 3-mercaptopropyltrimethoxysilane; antioxidants, such as 2,2-thiobis(4-methyl-6-t-butylphenol) and 2,6-di-t-butylphenol; ultraviolet absorbents, such as 2-(3-t-butyl-5-methyl-2-hydroxyphenyl)-5-chlorobenzotriazole and alkoxybenzophenones; and aggregation inhibitors, such as sodium polyacrylic acid.

With the intention of producing a further improvement in developability of the present composition through the elevation of alkali solubility of the radiation-unirradiated area, organic carboxylic acids, preferably an organic carboxylic acid having a low molecular weight of at most 1,000, can be added to the present composition. Specific examples of such an organic carboxylic acid include aliphatic monocarboxylic acids, such as formic acid, acetic acid, propionic acid, butyric acid, valeric acid, pivalic acid, caproic acid, diethylacetic acid, enanthic acid and caprylic acid; aliphatic dicarboxylic acids, such as oxalic acid, malonic acid, succinic acid, glutaric acid, adipic acid, pimelic acid, suberic acid, azelaic acid, cebacic acid, brassylic acid, methylmalonic acid, ethylmalonic acid, dimethylmalonic acid, methylsuccinic acid, tetramethylsuccinic acid and citraconic acid; aliphatic tricarboxylic acids, such as tricarballyic acid, aconitic acid and campholonic acid; aromatic monocarboxylic acids, such as benzoic acid, toluic acid, cuminic acid, hemellitic acid and mesitylenic acid; aromatic polycarboxylic acids, such as phthalic acid, isophthalic acid, terephthalic acid, trimellitic acid, trimesic acid, mellophanic acid and pyromellitic acid; and other carboxylic acids, including phenylacetic acid, hydroatropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

To the present composition, dispersants for enhancing the dispersibility of pigments can be added although they are not always needed in the present invention. Such a dispersant can be selected from a wide variety of conventional dispersants, including phthalocyanine derivatives (e.g., EFKA-745, a commercial product of EFKA); organosiloxane polymers (e.g., KP341, produced by Shin-etsu Chemical Industry Co., Ltd.); (meth)acrylic (co)polymers (e.g., Polyflow No. 75, No. 90 and No. 95, produced by Kyoei-sha Yushi Kagaku Kogyo); cationic surfactants (e.g., W001, produced by Yusho); nonionic surfactants, such as polyoxyethylene lauryl ether, polyoxyethylene stearyl ether, polyoxyethylene oleyl ether, polyoxyethylene octyl phenyl ether, polyoxyethylene nonyl phenyl ether, polyoxyethylene glycol dilaurate, polyethylene glycol distearate and sorbitan fatty acid esters; fluorine-containing surfactants, such as Eftop EF301, EF303 and EF352 (commercial names, products of Shin-Akita Kasei K.K.), Megafac F171, F172 and F173 (commercial names, products of Dainippon Ink & Chemicals, Inc.), Florad FC430 and FC431 (commercial names, products of Sumitomo 3M Co., Ltd.), Asahiguard AG710, Surflon S382, SC-101, SC-102, SC-103, SC-104, SC-105 and SC-1068 (commercial names, products of Asahi Glass Company, Ltd.); anionic surfactants, such as W004, W005 and W017 (produced by Yusho); polymeric dispersants, such as EFKA-46, EFKA-47, EFKA-47EA, EFKA POLYMER 100, EFKA POLYMER 400, EFKA POLYMER 401 and EFKA POLYMER 450 (which are products of EFKA), and Disperse Aid 6, Disperse Aid 8, Disperse Aid 15 and Disperse Aid 9100 (which are products of San-Nopco); various kinds of solsperse dispersants, such as Solsperse 3000, 5000, 9000, 12000, 13240, 13940, 17000, 20000, 24000, 26000 and 28000 (produced by Zeneka); and Isonet S-20 (produced by Sanyo Chemical Industries Co., Ltd.).

These dispersants may be used alone or as a mixture of two or more thereof. In the pigment dispersion, they are generally used in an amount of 0.1 to 50 parts by weight per 100 parts by weight of pigment.

Besides the additives as mentioned above, it is desirable to add a thermopolymerization inhibitor to the present radiation sensitive colored composition. The compounds useful for such a thermopolymerization inhibitor are, for example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzoimidazole and so on.

Specific examples of a solvent used in preparing the present composition include esters, such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, methyl hydroxyacetate, ethyl hydroxyacetate, butyl hydroxyacetate, methyl methoxyacetate, ethyl methoxyacetate, butyl methoxyacetate, methyl ethoxyacetate, ethyl ethoxyacetate, alkyl 3-hydroxypropionates (e.g., methyl 3-hydroxypropionate, ethyl 3-hydroxypropionate), methyl 3-methoxypropionate, ethyl 3-methoxypropionate, methyl 3-ethoxypropionate, ethyl 3-ethoxypropionate, methyl 2-hydroxypropionate, ethyl 2-hydroxypropionate, propyl 2-hydroxypropionate, methyl 2-methoxypropionate, ethyl 2-methoxypropionate, propyl 2-methoxypropionate, methyl 2-ethoxypropionate, ethyl 2-ethoxypropionate, methyl 2-hydroxy-2-methylpropionate, ethyl 2-hydroxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-hydroxybutanate and ethyl 2-hydroxybutanate; ethers, such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methylether acetate, propylene glycol ethylether acetate and propylene glycol propylether acetate; ketones, such as methyl ethyl ketone, cyclohexanone, 2-heptanone and 3-heptanone; and aromatic hydrocarbons, such as toluene and xylene.

Of those solvents, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate and propylene glycol methylether acetate are preferred over the others.

These solvents may be used alone or in combination of two or more thereof.

The present composition can be prepared by mixing and dispersing the aforementioned components (A), (B) and (C), and further an alkali-soluble resin and other additives, if needed, in a solvent by means of mixing or/and dispersing machines.

As for the mixing and the dispersing machines, conventional machines can be used. As examples of such machines, mention may be made of a homogenizer, a kneader, a ball mill, a two- or three-rod roll mill, a paint shaker, a sand grinder and a sand mill such as Dyno-Mill.

In a desirable preparation process, the first step comprises adding a solvent to a pigment and a binding resin, mixing them homogeneously, and further kneading them by means of a two- or three-rod roll mill, if necessary, while heating so that the pigment and the binder are well attached to each other, thereby preparing a homogenous colored matter.

The second step comprises adding a solvent to the homogeneous colored matter prepared in the first step, further adding thereto various additives as mentioned above, including a dispersant, if needed, and dispersing these ingredients into the solvent by means of a ball mill or a sand mill using glass beads as a dispersing medium, e.g., Dyno-Mill. Herein, the dispersed particles becomes finer the smaller the diameter of the glass beads used is. Further, highly consistent dispersing results can be obtained by controlling so as to maintain the temperature of the dispersing system constant.

The dispersion prepared in the above process can be subjected to centrifugation or/and decantation for removal of coarse particles therefrom.

The desirable size of the pigment particles in the thus prepared dispersion is 1 μm or below, preferably from 0.02 to 0.3 μm.

The colored dispersion obtained in the above manner is mixed with a radiation sensitive compound as the component (B), and used as a radiation sensitive composition.

The application of the present composition to a substrate is performed using a spin coating method, a cast coating method, a roll coating method or the like to form a radiation sensitive composition layer. The composition layer is exposed to radiation via the desired mask pattern, and then developed with a developing solution to form a colored pattern. As the radiation employed therein, ultraviolet rays, such as g-line and i-line, are preferred in particular.

Examples of a substrate which can be used include a soda glass plate, a Pyrex glass plate, a quartz glass plate and transparent conductive film-attached glass plates, which are used for liquid crystal display elements and the like, and photoelectric converter substrates used for solid image-pickup elements and the like, such as a silicon substrate. On these substrates, black stripes for isolating pixels from one another are generally formed.

With respect to the developing solution, any solution can be used so far as it cannot dissolve the radiation-exposed area but can dissolve the radiation-unexposed area in the coating of the present radiation sensitive colored composition. Specifically, a combination of two or more of various organic solvents and an alkaline aqueous solution can be used. As examples of such organic solvents, mention may be made of the solvents recited above as those usable for the preparation of the present composition.

The alkaline aqueous solution which can be used as the developing solution is a solution prepared by dissolving in water an alkaline compound, such as sodium hydroxide, potassium hydroxide, sodium carbonate, sodium silicate, sodium metasilicate, aqueous ammonia, ethylamine, diethylamine, dimethyl ethanolamine, tetramethylammonium hydroxide, tetraethylammonium hydroxide, choline, pyrrole, piperidine or 1,8-diazabicyclo-[5,4,0]-7-undecene, so that its concentration is from 0.001 to 10 weight %, preferably from 0.01 to 1 weight %. When such an alkaline aqueous solution is used for the development, the developed coating is generally washed with water.

EXAMPLES

The present invention will now be illustrated in more detail by reference to the following examples, but the invention should not be construed as being limited to these examples so far as changes and modifications are made within the scope of the invention.

Example 1

| | |
|---|---|
| 30 wt % Solution of present graft Copolymer [A-1] in propylene glycol monomethylether acetate | 20 parts |
| Methylmethacrylate/methacrylic acid (80/20 by weight) copolymer | 40 parts |
| Dipentaerythritol pentaacrylate | 40 parts |
| C.I. Pigment Red 155 | 30 parts |
| C.I. Pigment Yellow 110 | 10 parts |
| 4-[o-Bromo-p-N,N-di(ethoxycarbonyl)aminophenyl]-2,6-di(trichloromethyl)-s-triazine | 3 parts |
| 7-[{4-Chloro-6-(diethylamino)-s-triazine-2-yl}amino]-3-phenylcoumarin | 2 parts |
| Hydroquinone monomethyl ether | 0.01 part |
| Propylene glycol monomethylether acetate | 500 part |

The above-described composition was kneaded in a three-rod roll mill, and dispersed by means of a sand mill (Dyno-Mill, made by Shinmaru Enterprises Corporation). After the dispersing process, the mixture was filtered through a filter having a pore size of 5 μm to obtain a radiation sensitive colored composition according to the present invention. The sizes of pigment grains in the thus obtained composition were measured with a laser beam scattering method-utilized microtrack UPA grain size analyzer, Model 9340 (made by Nikkiso K.K.). As a result of this measurement, the average grain size was found to be 0.06 μm and the proportion of grains having a grain size of 0.1 μm or below was found to be 100% to the total grains. Although the thus obtained composition was allowed to stand for 2 weeks, neither sedimentation of the pigment grains nor precipitation of polymers were observed, and the composition underwent no change in viscosity and retained a homogeneously dispersed state. By additional one-week standing, the composition caused slight sedimentation of pigment grains, but the sedimented grains were redispersed with ease only by lightly shaking the vessel.

The composition prepared above was coated on a glass substrate for color filter use in a dry thickness of 1.5 μm by means of a spin coater, and dried at 100° C. for 2 minutes to obtain a red uniform coating.

The exposure of 200 mJ/cm$^2$ was applied to this coating via a mask by means of a 2.5 kW superhigh pressure mercury lamp, and then the development was performed by the immersion in a 0.5% water solution of sodium carbonate. The image area of the coating was free from pin hole, roughening of the surface and coming-off of pixels, the non-image area was free from development residue, the pattern having from 10 to 200 μm fine lines was reproduced in the coating, and the reproduced pattern had a sharp edge.

Comparative Example 1

Another radiation sensitive colored composition was prepared in the same manner as in Example 1, except that the present graft Copolymer [A-1] was not used but the methylmethacrylate/methacrylic acid copolymer alone was used as binding resin. The sizes of pigment grains in the thus obtained composition was measured with the same grain size analyzer as used in Example 1. The results obtained are shown in Table 3.

By allowing the thus prepared composition to stand for 2 weeks, the pigment grains were sedimented and the viscosity was decreased. In the same manner as in Example 1, the composition was coated, exposed and developed. The fine-line pattern thus reproduced was observed to have a rough edge, and further the pigment residue was observed in the non-image area.

Examples 2 to 4 and Comparative Example 2

Radiation sensitive compositions comprising the present graft copolymers and/or binding resins set forth in Table 3 were kneaded and dispersed in the same manner as in Example 1, and therefrom color filter patterns were formed in the same way as in Example 1.

The compositions prepared above and the patterns formed therefrom were evaluated according to the criteria described below. The results obtained are collected in Table 3. As can be seen from Table 3, the evaluation results of the compositions according to the present invention were good in all respects.

The following are characteristics evaluated and evaluation criteria.

transmittance (green, blue) ±50 nm is 10% or below in the image formed, when the maximum transmittance is 80% or above, the transmittance is regarded as satisfactory and represented by the mark 0; while the transmittance is regarded as unsatisfactory and represented by the mark x when the maximum transmittance is below 80%.

Definition of Contrast Ratio Evaluation;

The contrast ratio is defined as the ratio between the cross brightness and the parallel brightness measured under the condition that a color filter inserted between two polarizing plates is mounted on a back light. The contrast ratio of 400 or higher is regarded as good (0), and the contrast ratio of lower than 400 is regarded as poor (x).

TABLE 3

| | Graft co-polymer | Binding resin combined | Dispersibility | Coming off of pixels | Development residue | Pattern reproduction | Average grain size Under 0.1μ proportion | Transmittance | Contrast ratio |
|---|---|---|---|---|---|---|---|---|---|
| Example 1 | A-1 | Methylmethacrylate/methacrylic acid co-polymer (80/20 by weight) | ○ | ○ | ○ | ○ | 0.06 μm 100% | ○ | ○ |
| Compar. Ex. 1 | none | Methylmethacrylate/methacrylic acid co-polymer (80/20 by weight) | X | X | X | X | 0.22 μm 39% | X | X |
| Example 2 | A-1 | Benzylmethacrylate/acrylic acid copolymer (85/15 by weight) | ⊚ | ○ | ○ | ○ | 0.05 μm 100% | ○ | ○ |
| Compar. Ex. 2 | none | Benzylmethacrylate/acrylic acid copolymer (85/15 by weight) | X | ○ | Δ | ○ | 0.20 μm 58% | X | X |
| Example 3 | A-2 | Methylmethacrylate/methacrylic acid co-polymer (85/15 by weight) | ○ | ○ | ○ | ○ | 0.07 μm 100% | ○ | ○ |
| Example 4 | A-3 | Methylmethacrylate/methacrylic acid co-polymer (85/15 by weight) | ○ | ○ | ○ | ○ | 0.06 μm 100% | ○ | ○ | x: poor
Δ: somewhat poor
0: good
⊚: excellent

Dispersibility:
Absence of sedimented pigment after two-week standing.
Coming-off of image:
Comparison of relative extents of defects ascribed to the coming-off of pixels having a line width of 20 μm.
Development residue:
Comparison of relative extents of development residues in non-image areas.
Pattern reproduction:
Extent of edge roughness of pixels having a line width of 20 μm.
Definition of Transmittance Evaluation;
With respect to the transmittance evaluation in cases where the transmittance at 580 nm (red) is 10% or below in the image formed, when the transmittance at 620 nm is 80% or above, the transmittance is regarded as satisfactory and represented by the mark 0; while the transmittance is regarded as unsatisfactory and represented by the mark x when the transmittance at 620 nm is below 80%.
With respect to the transmittance evaluation in other cases where the transmittance at the wavelengths of the maximum Example 5

The following composition instead of the radiation sensitive composition of Example 1 was dispersed, coated, exposed and then developed in the same manner in Example 1 to form a color filter pattern. The color filter pattern formed was evaluated in the same way as in Example 1, and the evaluation results thereof were found to be as good as those of the composition prepared in Example 1.

| | |
|---|---|
| 40 wt % Solution of present graft Copolymer [A-2] in toluene | 50 parts |
| Benzylmethacrylate/methacrylic acid (80/20 by weight) copolymer | 40 parts |
| Dipentaerythritol hexaacrylate | 40 parts |
| C.I. Pigment Red 177 | 30 parts |
| C.I. Pigment Yellow 139 | 10 parts |
| 2-(2-Chlorophenyl)-4,5-diphenylimidazolyl dimer | 2 parts |
| Michler's ketone | 1 part |
| 2-Mercapto-5-methylthio-1,3,4-thiazole | 1 part |
| Hydroquinone monomethyl ether | 0.01 part |
| Propylene glycol monomethylether acetate | 250 parts |
| Ehyl 3-ethoxypropionate | 250 parts |

Examples 6 to 9 and Comparative Examples 3 to 4

Other radiation sensitive compositions were prepared in the same manner as in Example 5, except that the graft copolymers set forth in Table 4 were used respectively. By using these compositions, color filter patterns were formed respectively, and evaluated in the same way as in Example 5. The evaluations results thus obtained are shown in Table 4 together with those in Example 5. As can be seen from Table 4, the radiation sensitive compositions according to the present invention achieved good results.

TABLE 4

| | Graft co-polymer | Binding resin combined | Dispersibility | Coming off of pixels | Development residue | Pattern reproduction | Average grain size Under 0.1μ proportion | Transmittance | Contrast ratio |
|---|---|---|---|---|---|---|---|---|---|
| Example 5 | A-2 | Benzylmethacrylate/methacrylic acid copolymer (80/20 by weight) | ○ | ○ | ○ | ○ | 0.06 μm 100% | ○ | ○ |
| Compar. Ex. 3 | none | Benzylmethacrylate/methacrylic acid copolymer (80/20 by weight) | X | X | X | X | 0.19 μm 66% | X | X |
| Compar. Ex. 4 | R-1 | Benzylmethacrylate/methacrylic acid copolymer (80/20 by weight) | X | X | X | X | 0.18 μm 60% | X | X |
| Example 6 | A-2 | none | ⊚ | ○ | Δ | ○ | 0.07 μm 100% | ○ | ○ |
| Example 7 | A-4 | same as in Example 5 | ○ | ○ | ○ | ○ | 0.07 μm 100% | ○ | ○ |
| Example 8 | A-5 | " | ○ | ○ | ○ | ○ | 0.07 μm 98% | ○ | ○ |
| Example 9 | A-6 | " | ○ | ○ | ○ | ○ | 0.08 μm 98% | ○ | ○ |

Examples 10 to 11 and Comparative Example 5

The following compositions instead of the radiation sensitive composition of Example 1 were each dispersed, coated, exposed and then developed in the same manner in Example 1 to form color filter patterns respectively. The color filter patterns formed were each evaluated in the same way as in Example 1. The evaluation results thus obtained are shown in Table 5. As can be seen from Table 5, the radiation sensitive compositions according to the present invention achieved good results equal to those obtained in Example 1.

| | |
|---|---|
| 40 wt % Solution of present graft copolymer (set forth in Table 5) in toluene | 50 parts |
| Binding resin used together (set forth in Table 5) | 40 parts |
| Dipentaerythritol hexaacrylate | 40 parts |
| C.I. Pigment Green 36 | 30 parts |
| C.I. Pigment Yellow 139 | 10 parts |
| 2-(2-Chlorophenyl)-4,5-diphenylimidazolyl dimer | 2 parts |
| Michler's ketone | 1 part |
| 2-Mercapto-5-methylthio-1,3,4-thiazole | 1 part |
| Hydroquinone monomethyl ether | 0.01 part |
| Propylene glycol monomethylether acetate | 250 parts |
| Ethyl 3-ethoxypropionate | 250 parts |

TABLE 5

| | Graft co-polymer | Binding resin combined | Dispersibility | Coming off of pixels | Development residue | Pattern reproduction | Average grain size Under 0.1μ proportion | Transmittance | Contrast ratio |
|---|---|---|---|---|---|---|---|---|---|
| Example 10 | A-3 | Methylmethacrylate/benzylmethacrylate/2-hydroxyethylmethacrylate/methacrylic acid quadripolymer (40/40/10/10 by weight) | ⊚ | ○ | ○ | ○ | 0.08 μm 95% | ○ | ○ |

TABLE 5-continued

| | Graft co-polymer | Binding resin combined | Dis-persi-bility | Coming off of pixels | Devel-opment residue | Pattern repro-duction | Average grain size Under 0.1μ proportion | Trans-mit-tance | Con-trast ratio |
|---|---|---|---|---|---|---|---|---|---|
| Compar. Ex. 5 | none | Methylmethacrylate/benz-ylmethacrylate/2-hydro-xyethylmethacrylate/meth-acrylic acid quadripolymer (40/40/10/10 by weight) | Δ | Δ | Δ | X | 0.20 μm 55% | X | X |
| Example 11 | A-3 | none | ⊚ | ○ | Δ | ○ | 0.07 μm 100% | ○ | ○ |
| Example 12 | A-8 | Benzylmethacrylate/methacrylic acid co-polymer (80/20 by weight) | ⊚ | ○ | ○ | ○ | 0.09 μm 85% | ○ | ○ |
| Example 13 | A-9 | Benzylmethacrylate/methacrylic acid co-polymer (80/20 by weight) | ⊚ | ○ | ○ | ○ | 0.10 μm 60% | ○ | ○ |
| Example 14 | A-22 | Benzylmethacrylate/methacrylic acid co-polymer (80/20 by weight) | ⊚ | ○ | ○ | ○ | 0.09 μm 78% | ○ | ○ |

Example 12

| | |
|---|---|
| 40 wt % Solution of present graft Copolymer [A-8] in toluene | 75 parts |
| Binding resin used together (set forth in Table 5) | 40 parts |
| Pentaerythritol tetraacrylate | 10 parts |
| 4-[p-N,N-di(ethoxycarbonylmethyl)]-2,6-di(trichloromethyl)-s-triazine | 2 parts |
| 7-[{4-Chloro-6-(diethylamino)-s-triazine-2-yl}amino]-3-phenylcoumarin | 2 parts |
| Hydroquinone monomethyl ether | 0.01 part |
| Propylene glycol monomethylether acetate | 20 parts |
| The above-described composition and the following processed pigments were kneaded in a three-rod roll mill to prepare a colored paste. | |
| Acrylic resin-processed C.I. Pigment Red 177 (Colortex Red U38N, produced by Sanyo Color Works, Ltd.) | 8 parts |
| Ethyl cellulose-processed C.I. Pigment Yellow 83 (Colortex Yellow 83, produced by Sanyo Color Works, Ltd.)) | 2 parts |

To the colored paste thus obtained, propylene glycol monomethylether acetate was added to adjust the solids concentration to 25 weight %, and dispersed by means of a Dyno-Mill, wherein glass beads having a diameter of 1 mm were used, thereby to obtain a radiation sensitive composition.

Although the thus obtained composition was allowed to stand for 2 weeks, no sedimentation was observed at all. By using this composition, a color filter pattern was formed in the same manner as in Example 1. The coatability, coming-off of pixels, development residue and pattern reproduction were each on a satisfactory level. These results are shown in Table 5.

Example 13

Twenty-five parts of a 40 weight % solution of present graft copolymer [A-9] in propylene glycol monomethylether acetate, 40 parts of binding resin used together (set forth in Table 5) and 10 parts of C.I. Pigment Red 155 were kneaded with a two-rod roll mill to obtain a sheet-form colored matter. The other sheet-form colored matter was prepared in the same manner as described above, except that the pigment used was replaced by 10 parts of C.I. Pigment Yellow 83.

A radiation sensitive composition was prepared in the same manner as in Example 1, except that Copolymer [A-9] was used as the present graft copolymer and a 8:2 by weight mixture of the foregoing red matter with the foregoing yellow matter was used as the pigment component.

Although the thus prepared composition was allowed to stand for 4 weeks, no sedimentation of pigments was observed at all. By using this composition, a color filter pattern was formed in the same manner as in Example 1. With respect to the coming-off of pixels, the development residue and the pattern reproduction, satisfactory results were achieved. These results are shown in Table 5.

Example 14

A color filter pattern was formed in the same manner as in Example 5, except that the graft Copolymer [A-22] was used in place of the graft Copolymer [A-2], and evaluated in the same way as in Example 1. The evaluation results obtained herein were as good as those achieved in Example 1. These results are also shown in Table 5.

Example 15

A color filter pattern was formed in the same manner as in Example 1 via dispersion, coating, exposure and development operations, except that the pigment used in Example 13 (10 parts of C.I. Pigment Red 155) was replaced by 30 parts of C.I. Pigment Blue 15 and 8 parts of C.I. Pigment Violet 19. The evaluation thereof was made in the same way as in Example 1. The results obtained herein were as good as those achieved in Example 1.

Example 16

On a glass substrate previously undergone a black matrix patterning operation, the radiation sensitive compositions prepared in Examples 5, 10 and 15 were each subjected successively to coating, exposure and development operations to form a color filter. In the thus formed color filter, the pattern of every color were free from coming-off of pixels and had no development residue, and further had a slight extent of depolarizing action and high contrast. The other characteristics evaluated in the same way as other Examples were all satisfactory (0).

Radiation sensitive colored compositions according to the present invention enable pigments to have high dispersibility and retain dispersion stability for a long time. By using these compositions can be formed a color filter which has excellent film properties, is almost free from development residue, ensures high adhesiveness in the pixels and has satisfactorily reproduced patterns.

While the invention has been described in detail and with reference to specific embodiments thereof, it will be apparent to one skilled in the art that various changes and modifications can be made therein without departing from the spirit and scope thereof.

What is claimed is:

1. A radiation sensitive colored composition comprising (A) a copolymer prepared by copolymerizing at least (1) a monofunctional macromonomer which has a weight-average molecular weight of $3 \times 10^4$ or below and comprises a polymeric moiety having a repetition of at least one kind of unit constituent represented by the following formula (IIa) or (IIb) and a polymerizable double bond-containing group represented by the following formula (I) situated at only one end of the polymeric moiety, (2) a monomer represented by the following formula (III), (3) a quaternary ammonium salt monomer and (4) a monomer having at least one unsubstituted or substituted acid amide group represented by the following formula (IV) in the molecule; (B) a radiation sensitive compound; and (C) a pigment:

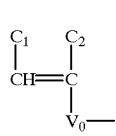

(I)

wherein $V_0$ represents —COO—, —OCO—, —CH$_2$OCO—, —CH$_2$COO—, —O—, —SO$_2$—, —CO—, —CONHCOO—, —CONHCONH—, —CONHSO$_2$—, —CON(P$_3$)—, —SO$_2$N(P$_3$)— or —C$_6$H$_4$—; P$_3$ represents a hydrogen atom or a hydrocarbon group; $c_1$ and $c_2$ are the same or different, and each of them represents a hydrogen atom, a halogen atom, a cyano group, a hydrocarbon group, —COO—Z' or a group having —COO—Z' via a hydrocarbon; and Z' represents a hydrogen atom or an optionally substituted hydrocarbon group:

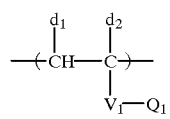

(IIa)

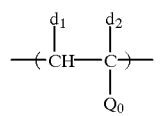

(IIb)

wherein $V_1$ has the same meaning as $V_0$ in formula (I); $Q_1$ represents an aliphatic group having 1 to 18 carbon atoms or an aromatic group having 6 to 12 carbon atoms; $d_1$ and $d_2$ are the same or different, and they have the same meanings as $c_1$ and $c_2$ in formula (I) respectively; $Q_0$ represents —CN or —C$_6$H$_4$—T; T represents a hydrogen atom, a halogen atom, a hydrocarbon group, an alkoxy group or —COOZ"; and Z" represents an alkyl group, an aralkyl group or an aryl group:

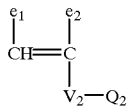

(III)

wherein $V_2$ has the same meaning as $V_1$ in formula (IIa); $Q_2$ has the same meaning as $Q_1$ in formula (IIa); and $e_1$ and $e_2$ have the same meanings as $c_1$ and $c_2$ in formula (I) respectively:

—CON(R$_1$)(R$_2$)    (IV)

wherein $R_1$ and $R_2$, which may be the same or different, each represents a hydrogen atom or a hydrocarbon group having 1 to 18 carbon atoms, which may have a substituent, or $R_1$ and $R_2$ may combine with each other via —O—, —S— or —NR$_3$—; and $R_3$ represents a hydrogen atom or a hydrocarbon group having 1 to 12 carbon atoms.

2. The radiation sensitive colored composition as claimed in claim 1, wherein said quaternary ammonium salt monomer is at least one monomer selected from the monomers of the following formulae (a) to (e):

(a)

H$_2$C=CR$^4$
|
(Z)$_n$    X$^-$
|
N$^+$
R$^1$ / | \ R$^3$
    R$^2$ (b)

H$_2$C=CR$^4$
|
(Z)$_n$    X$^-$
|
N$^+$—R$^1$
( )
Q (c)

H$_2$C=CR$^4$
|
(Z)$_n$    X$^-$
|
R$^5$—C—N$^+$
      \\_Q/

(d)

H$_2$C=CR$^4$
|
(Z)$_n$    X$^-$
Q
\\
N$^+$
R$^1$ / \\ R$^2$

-continued

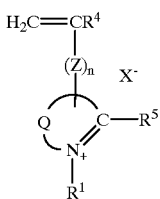
(e)

wherein $R^1$, $R^2$ and $R^3$ are each a hydrogen atom, or each of them has the same meaning as $Q_1$ in formula (IIa); $R^4$ and $R^5$ have the same meanings as $c_1$ and $c_2$ in formula (I) respectively; Q represents atoms completing a heterocyclic ring; $X^-$ is an anion; Z is a linkage group selected from the group consisting of $-R^6-$, $-C(O)-OR^6-$, $-C(O)-NH-R^6-$, $-O-C(O)-R^6-$ and $-CH_2OC(O)-R^6$, wherein $R^6$ has the same meaning as $Q_1$ in formula (I); and n is 0 or 1.

3. The radiation sensitive colored composition as claimed in claim 2, wherein said monomer having at least one unsubstituted or substituted acid amido group represented by formula (IV) in the molecule is a monomer represented by the following formula (V):

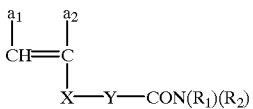
(V)

wherein $a_1$ and $a_2$ have the same meanings as $c_1$ and $c_2$ in formula (I) respectively; $R_1$ and $R_2$ have the same meanings as $R_1$ and $R_2$ in formula (IV) respectively; X represents a single bond, $-COO-$, $-OCO-$, $-(CH_2)_{u1}-COO-$, $-(CH_2)_{u2}-OCO-$, wherein u1 and u2 are each an integer of 1 to 3, $-CON(R_4)-$, wherein $R_4$ is a hydrogen atom or a hydrocarbon group having 1 to 12 carbon atoms, $-CONH-COO-$, $-O-$, $-C_6H_4-$ or $-SO_2-$; and Y represents a single bond, a linkage group selected from the group consisting of $-[C(R_5)(R_6)]-$, $-C_6H_4-$, $-C_6H_{10}-$, $-(CH_2)_n-$, $-[C(R_7)=C(R_8)]-$, $-COO-$, $-OCO-$, $-O-$, $-S-$, $-SO_2-$, $-N(R_9)-$, $-CON(R_{10})-$, $-SO_2N(R_{11})-$, $-NHCOO-$, $-NHCONH-$ and $-C(=O)-$, or a combination of two or more of the linkage groups recited above, wherein $R_5$, $R_6$, $R_7$ and $R_8$, which may be the same or different, each represents a hydrogen atom, a halogen atom or a hydrocarbon group having 1 to 7 carbon atoms, $R_9$, $R_{10}$ and $R_{11}$ each have the same meaning as the foregoing $R_4$, and n represents an integer of 2 to 8.

4. The radiation sensitive colored composition as claimed in claim 3, wherein the monomer of formula (V) is a monomer represented by the following formula (VI):

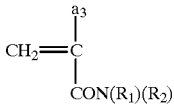
(VI)

wherein $a_3$ has the same meaning as $a_1$ or $a_2$ in formula (V), and $R_1$ and $R_2$ have the same meanings as $R_1$ and $R_2$ in formula (IV) respectively.

5. The radiation sensitive colored composition as claimed in claim 4, wherein the monomer of formula (VI) is acrylamide or methacrylamide.

6. The radiation sensitive colored composition as claimed in claim 1, wherein said monomer having at least one unsubstituted or substituted acid amido group represented by formula (IV) in the molecule is a monomer represented by the following formula (V):

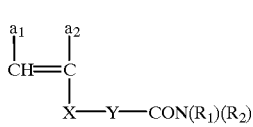
(V)

wherein $a_1$ and $a_2$ have the same meanings as $c_1$ and $c_2$ in formula (I) respectively; $R_1$ and $R_2$ have the same meanings as $R_1$ and $R_2$ in formula (IV) respectively; X represents a single bond, $-COO-$, $-OCO-$, $-(CH_2)_{u1}-COO-$, $-(CH_2)_{u2}-OCO-$, wherein u1 and u2 are each an integer of 1 to 3, $-CON(R_4)-$, wherein $R_4$ is a hydrogen atom or a hydrocarbon group having 1 to 12 carbon atoms, $-CONH-COO-$, $-O-$, $-C_6H_4-$ or $-SO_2-$; and Y represents a single bond, a linkage group selected from the group consisting of $-[C(R_5)(R_6)]-$, $-C_6H_4-$, $-C_6H_{10}-$, $-(CH_2)_n-$, $-[C(R_7)=C(R_8)]-$, $-COO-$, $-OCO-$, $-O-$, $-S-$, $-SO_2-$, $-N(R_9)-$, $-CON(R_{10})-$, $-SO_2N(R_{11})-$, $-NHCOO-$, $-NHCONH-$ and $-C(=O)-$, or a combination of two or more of the linkage groups recited above, wherein $R_5$, $R_6$, $R_7$ and $R_8$, which may be the same or different, each represents a hydrogen atom, a halogen atom or a hydrocarbon group having 1 to 7 carbon atoms, $R_9$, $R_{10}$ and $R_{11}$ each have the same meaning as the foregoing $R_4$, and n represents an integer of 2 to 8.

7. The radiation sensitive colored composition as claimed in claim 6, wherein the monomer of formula (V) is a monomer represented by the following formula (VI):

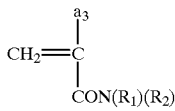
(VI)

wherein $a_3$ has the same meaning as $a_1$ or $a_2$ in formula (V), and $R_1$ and $R_2$ have the same meanings as $R_1$ and $R_2$ in formula (IV) respectively.

8. The radiation sensitive colored composition as claimed in claim 7, wherein the monomer of formula (VI) is acrylamide or methacrylamide.

9. The radiation sensitive colored composition as claimed in claim 1, which further comprises an alkali-soluble resin.

* * * * *